United States Patent
Low et al.

(10) Patent No.: US 7,827,461 B1
(45) Date of Patent: Nov. 2, 2010

(54) LOW-DENSITY PARITY-CHECK DECODER APPARATUS

(75) Inventors: Seo-How Low, San Jose, CA (US);
Nedeljko Varnica, Sunnyvale, CA (US);
Gregory Burd, San Jose, CA (US);
Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 461 days.

(21) Appl. No.: 11/857,305

(22) Filed: Sep. 18, 2007

Related U.S. Application Data

(60) Provisional application No. 60/826,026, filed on Sep. 18, 2006.

(51) Int. Cl.
*H03M 13/00* (2006.01)
(52) U.S. Cl. .................. 714/752; 714/786; 714/799
(58) Field of Classification Search .............. 714/752, 714/786, 799
See application file for complete search history.

(56) References Cited

U.S. PATENT DOCUMENTS

| | | | | |
|---|---|---|---|---|
| 6,633,856 B2 * | 10/2003 | Richardson et al. | ........... | 706/15 |
| 7,133,853 B2 * | 11/2006 | Richardson et al. | ........... | 706/15 |
| 7,178,081 B2 * | 2/2007 | Lee et al. | ..................... | 714/752 |
| 7,395,491 B2 * | 7/2008 | Chen | .......................... | 714/780 |
| 7,451,361 B2 * | 11/2008 | Schmidt | ..................... | 714/701 |
| 7,484,158 B2 * | 1/2009 | Sharon et al. | ............... | 714/755 |
| 7,555,696 B2 * | 6/2009 | Schmidt | ..................... | 714/758 |

OTHER PUBLICATIONS

Shimizu et al., "Partially-Parallel LDPC Decoder Based on High-Efficiency Message-Passing Algorithm," IEEE Conference on Computer Design (ICCD), Oct. 2005, San Jose, CA; available at www.iccd-conference.org/proceedings/2005/080_shimizu_partially.pdf.

Kim et al., "Parallel VLSI Architectures for a Class of LDPC Codes," IEEE Int'l Symposium of Circuits and Systems (ISCAS), 2002; available at www-cdslab.ece.umn.edu/cdslab/library/papers/iscas_02a.pdf.

* cited by examiner

*Primary Examiner*—Esaw T Abraham

(57) ABSTRACT

A low-density parity-check (LDPC) decoder includes a plurality of bit node processing elements, and a plurality of check node processing elements. The LDPC decoder also includes a plurality of message passing memory blocks. A first routing matrix couples the plurality of bit node processing elements to the plurality of message passing memory blocks. A second routing matrix couples the plurality of check node processing elements to the plurality of message passing memory blocks. The first routing matrix and the second routing matrix enable each bit node to exchange LDPC decoding messages with an appropriate check node via a corresponding one of the message passing memory blocks.

7 Claims, 16 Drawing Sheets

LOW-DENSITY PARITY-CHECK DECODER APPARATUS

CROSS-REFERENCE TO RELATED APPLICATION

The present application claims the benefit of U.S. Provisional Application No. 60/826,026, entitled "LDPC Decoder Architecture for Holographic Storage Systems," filed on Sep. 18, 2006, which is hereby incorporated by reference herein in its entirety.

FIELD OF TECHNOLOGY

The present disclosure relates generally to error correcting codes, and more particularly, to decoders for decoding low-density parity-check codes.

DESCRIPTION OF THE RELATED ART

Holographic storage is an optical storage technology for storing information at a high density. Unlike many other storage technologies such as magnetic disk drives and compact-disk drives that essentially use only the surface of a media to store information, holographic storage systems utilize a volume of the media. Additionally, many information holograms can be superimposed or multiplexed in the same volume of the medium. Typically, data is stored as a "page", which may include many information bits such as approximately 1 million bits. Many "pages" may be stored in the same three-dimensional space.

Typically, data pages are written as bit-arrays using a spatial light modulator (SLM). Different pages may be written to the same three-dimensional space using, for example, different beam incidence angles or different beam wavelengths. To write to the media, mutually coherent light from a reference beam and a signal beam creates an interference pattern in the media. This interference pattern alters the media, thus storing information.

When the information is to be retrieved or read out from the hologram, only the reference is beam is utilized. The reference beam is transmitted into the media at the same angle, wavelength, etc., as when the hologram was written. As a result of changes in the media that were created during the writing of the information, the beam splits into two parts. One of these parts recreates the signal beam corresponding to the stored information. A photo detector, such as a charge-coupled device (CCD) camera or a CMOS camera, detects the reconstructed bit-array.

Noise is inherent in a holographic storage channel. Thus, holographic storage systems typically use error recovery techniques such as forward-error correction (FEC) codes. Low-density parity-check (LDPC) codes are a type of FEC code. LDPC codes are especially efficient in that they allow transmission of data across a noisy communication channel at a rate that is very close to the theoretical limit for the channel known as the Shannon Limit.

SUMMARY OF THE DISCLOSURE

In one embodiment, a low-density parity-check (LDPC) decoder apparatus comprises a plurality of bit node processing elements, and a plurality of check node processing elements. The LDPC decoder also comprises a plurality of message passing memory blocks. A first routing matrix couples the plurality of bit node processing elements to the plurality of message passing memory blocks. A second routing matrix couples the plurality of check node processing elements to the plurality of message passing memory blocks. The first routing matrix and the second routing matrix enable each bit node to exchange LDPC decoding messages with an appropriate check node via a corresponding one of the message passing memory blocks.

In another aspect, a method for calculating bit-node-to-check-node message values and hard decisions in a low density parity-check (LDPC) decoder includes generating a plurality of scaled check-node-to-bit-node message values, and generating a plurality of bit-node-to-check-node message values based on the scaled check-node-to-bit-node message values and a bit value corresponding to the data to be decoded. The method also includes generating a hard decision based on an addition of one of the bit-node-to-check-node message values with one of the scaled check-node-to-bit-node message values.

In another embodiment, a bit node processing element for a low density parity-check (LDPC) decoder comprises a plurality of multipliers to generate scaled check-node-to-bit-node message values, and a plurality of first adders coupled to the plurality of multipliers to generate a plurality of bit-node-to-check-node message values based on the scaled check-node-to-bit-node message values and a bit value corresponding to the data to be decoded. The bit node processing element additionally comprises a second adder coupled to an output of one of first adders and one of the multipliers to generate a hard decision.

In yet another embodiment, a method for calculating bit-node-to-check-node message values in a low density parity-check (LDPC) decoder includes generating a plurality of scaled check-node-to-bit-node message values, and discarding at least a ½ least significant bit and a ¼ least significant bit from each of the scaled check-node-to-bit-node message values. The method also includes generating a rounding value based on a number of one-valued ½ least significant bits resulting from the generation of the scaled check-node-to-bit-node message values. Additionally, the method includes generating a sum of the plurality of scaled check-node-to-bit-node message values, a bit value corresponding to the data to be decoded, and the rounding value. The method further includes subtracting one of the scaled check-node-to-bit-node message values from the sum for each one of a plurality of bit-node-to-check-node message values.

In still another embodiment, a bit-node processing element for a low density parity-check (LDPC) decoder comprises a plurality of multipliers to multiply a plurality of check-node-to-bit-node message values with a scaling value. The bit node processing element also comprises a first adder having inputs coupled to outputs of multipliers in a first subset of the multipliers, and a second adder having a first input coupled to an output of a multiplier in a second subset of the multipliers, the second adder having a second input coupled to a bit value corresponding to the data to be decoded. The bit node processing element additionally comprises a plurality of subtractors coupled to the second adder, each subtractor having an input coupled to an output of a corresponding multiplier.

In another aspect, a method for calculating check-node-to-bit-node message values in a low density parity-check (LDPC) decoder includes receiving a plurality of bit-node-to-check-node message values, and determining a first-minimum of the plurality of bit-node-to-check-node message values using a plurality of minimum selection blocks. Additionally, the method includes selecting a plurality of second-minimum candidates for a second minimum of the plurality of bit-node-to-check-node message values based on selections made by the plurality of minimum selection blocks. The method also includes determining a second-minimum of the plurality of bit-node-to-check-node message values by selecting the minimum of the plurality of second minimum candidates. The method further includes generating a plurality of check-node-to-bit-node message values based on the first-minimum and the second-minimum.

In another embodiment, a check-node processing element for a low density parity-check (LDPC) decoder comprises a plurality of first minimum selection blocks coupled to determine a first-minimum of a plurality of bit-node-to-check-node message values, the plurality of first minimum selection blocks including a final first minimum selection block. The check node processing element also comprises a plurality of multiplexers coupled to select a plurality of second-minimum candidates for a second minimum of the plurality of bit-node-to-check-node message values. Additionally, the check node processing element comprises a multiplexer controller coupled to the plurality of multiplexers and the plurality of first minimum selection blocks to control the first plurality of multiplexers based on selections made by the plurality of first minimum selection blocks. The check node processing element further comprises a second minimum selection block coupled to the plurality of multiplexers to determine a second-minimum of the plurality of bit-node-to-check-node message values from the plurality of second-minimum candidates. Still further, the check node processing element comprises a check-node-to-bit-node message generator coupled to the final first minimum selection block and the second minimum selection block, the check-node-to-bit-node message generator to generate a plurality of check-node-to-bit-node message values based on the first minimum and the second minimum.

DETAILED DESCRIPTION

Example low-density parity-check (LDPC) decoding techniques are described subsequently in the context of a holographic storage system. It is to be understood, however, that these LDPC techniques may be utilized in other contexts as well such as other types of storage systems. Additionally, these LDPC techniques may be utilized in communication systems, for example.

Figure 1:
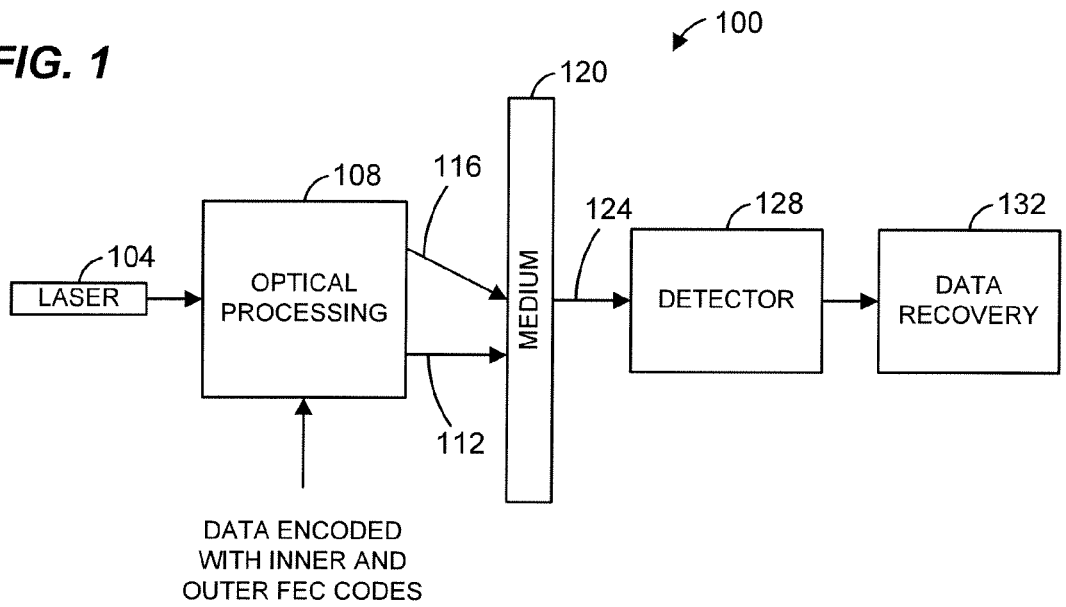
FIG. 1 is a block diagram of an example holographic storage system.

FIG. 1 is a block diagram of an example holographic storage system 100. The system 100 includes a laser 104 that generates a laser light that is optically coupled to an optical processing system 108. The optical processing system 108 may include one or more beam lenses, mirrors, splitters, etc. The optical processing system 108 may also include a spatial light modulator (SLM) to encode data onto a beam to generate a signal beam 112. The SLM may encode data onto the beam in the form of a holographic bit array, for example. The data that the SLM receives is itself encoded by two FEC codes: an inner code (LDPC code) and an outer code, such as a Reed-Solomon code. Such FEC coding is utilized because the storage channel is noisy.

The optical processing system 108 also generates a reference beam 116. During a write process, the signal beam 112 and the reference beam 116 are transmitted to a medium 120 to illuminate the medium 120. The signal beam 112 interferes with the reference beam 116 to create a hologram on the medium 120, thus causing data to be written to the medium 120.

After a hologram has been stored on the medium 120, the associated data may be recovered by a read process. During the read process, only the reference beam 116 illuminates the medium, and the hologram previously stored on the medium diffracts the reference beam 116 to generate a beam 124 that is substantially similar to the signal beam 112 that was used to create the hologram. The beam 124 is optically coupled to a detector 128 that may comprise a photodetector such as a charge-coupled device (CCD) camera or a CMOS camera. The detector 128 may generate pseudo-analog values that represent a pixelated image corresponding to the beam 124. A data recovery system 132 coupled to the detector 128 may convert the pseudo-analog values from the detector 128 into digital values and may process the pixelated image to help counteract the effects of distortions in the storage channel. The data recover system 132 also includes FEC decoders for decoding the recovered data. In particular, the data recover system 132 includes an inner code decoder (an LDPC decoder) and an outer code decoder, such as a Reed-Solomon decoder. The inner code decoder receives log-likelihood ratio (LLR) values corresponding to the processed pixelated image and generates LDPC decoded values. The outer code decoder is coupled to the inner code decoder and further decodes the LDPC decoded values according to the outer code. A goal of the data recovery system 132 is to recover substantially the original data that was written to the medium 120.

Figure 2:
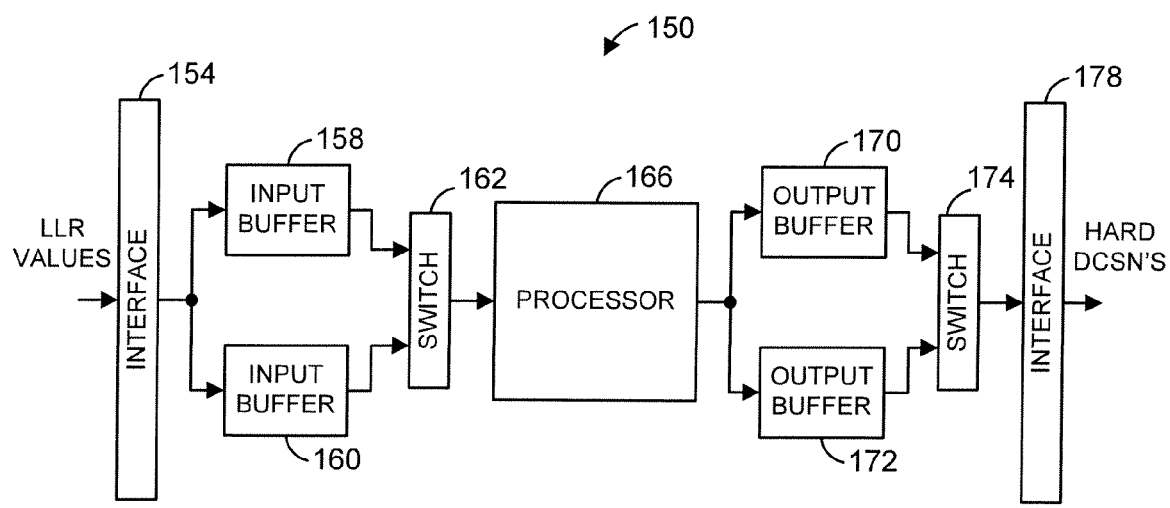
FIG. 2 is a block diagram of an example inner code decoder that may be utilized with the holographic storage system of FIG. 1.

FIG. 2 is a block diagram of an example inner code decoder 150 that may be utilized with the holographic storage system 100 of FIG. 1. For example, the data recovery system 132 may include the inner code decoder 150. Of course, a decoder such as the inner code decoder 150 could be used in other systems as well, such as other types of storage systems, communication systems, etc.

The inner code decoder 150 is configured to decode an LDPC code. The inner code decoder 150 includes an input interface 154 that receives LLR values that were generated by the detector 128. An output of the input interface 154 is coupled to an input of a first input buffer 158 and an input of a second input buffer 160. Outputs of the input buffer 158 and the input buffer 160 are coupled to a switch 162. An output of the switch 162 is coupled to an input of a processor 166. The processor 166, which will be described in more detail subsequently, decodes the LLR values to generate hard decision values.

An output of the processor 166 is coupled to an input of a first output buffer 170 and an input of a second output buffer 172. Outputs of the output buffer 170 and the output buffer 172 are coupled to a switch 174. An output of the switch 174 is coupled to an output interface 178. An output of the output interface 178 provides hard decisions generated by the processor 166. The output of the output interface 178 may be coupled to an input of an outer code decoder, for example.

As can be seen in FIG. 2, the inner code decoder 150 utilizes double buffering, which may help reduce latency during the transfer of data to and from the processor 166. Also, the input interface 154, the output interface 178 and the input and output buffers allow the processor 166 to operate at a different speed than systems to which it is coupled. For example, the processor 166 may operate at a higher clock speed as compared to systems from which the inner code decoder 150 receives LLR values and/or to which the inner code decoder 150 provides hard decision values.

In operation, the LLR values received via the input interface 154 are stored in one of the first input buffer 158 or the second input buffer 160. For example, the processor 166 may retrieve LLR values corresponding to a first codeword from the first input buffer 158 while LLR values corresponding to a second codeword are received via the input interface 154 and stored in the second input buffer 160. Similarly, the processor 166 may retrieve LLR values corresponding to a first codeword from the second input buffer 160 while LLR values corresponding to a second codeword are received via the input interface 154 and stored in the first input buffer 158.

The processor 166 receives LLR values corresponding to codewords via the switch 162. Hard decisions generated by the processor 166 are stored in one of the first output buffer 170 or the second output buffer 172. For example, the processor 166 may store hard decision values corresponding to a first codeword to the first output buffer 170 while hard decision values corresponding to a second codeword are output from the second output buffer 172 via the switch 174 and the output interface 154. Similarly, the processor 166 may store hard decision values corresponding to a first codeword to the second output buffer 172 while hard decision values corresponding to a second codeword are output from the first output buffer 170 via the switch 174 and the output interface 154.

One of ordinary skill in the art will recognize many variations of the example inner code decoder 150 are possible. For example, one or more of the buffers may be omitted. For instance, only one input buffer and/or only one output buffer may be utilized. In such implementations, one or both of the switches 162 and 174 may also be omitted. As another example, all of the buffers and both of the switches 162 and 174 may be omitted. Also, one or more of the interfaces 154 or 174 may be omitted.

Figure 3:
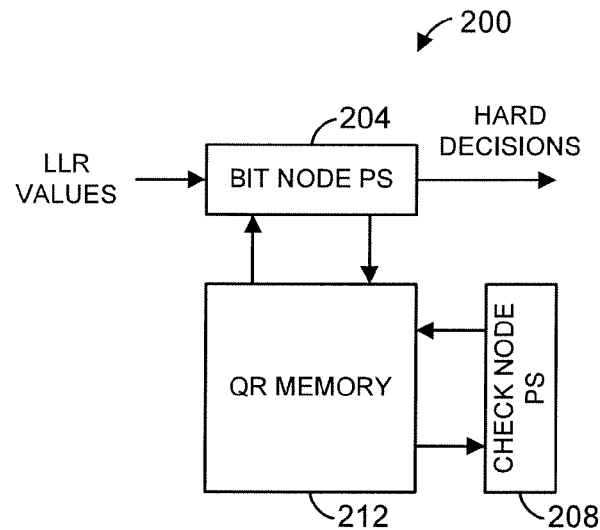
FIG. 3 is a block diagram of an example low-density parity-check (LDPC) decoder processor that may be utilized with the inner code decoder of FIG. 2.

FIG. 3 is a block diagram of an example LDPC decoder processor 200 that may be utilized with the inner code decoder 150 of FIG. 2. For example, the processor 166 may include the LDPC decoder processor 200. Of course, a decoder such as the LDPC decoder processor 200 could be used in other systems as well, such as other types of storage systems, communication systems, etc.

The LDPC decoder processor 200 includes a bit node processing system (PS) 204 and a check node PS 208. A memory system 212 is coupled to both the bit node PS 204 and the check node PS 208, and the bit node PS 204 and the check node PS 208 pass messages to each other via the memory system 212. The bit node PS 204 receives LLR values to be decoded, and the bit node PS 204 and the check node PS 208 iteratively decode the LDPC encoded LLR values. Hard decisions are generated by the bit node PS 204. The bit node PS 204 receives LLR values from the input buffer 158 and the input buffer 160 (FIG. 2), for example. Also, bit node PS 204 stores hard decisions in the output buffer 170 and the output buffer 172 (FIG. 2). Optionally, the LDPC decoder processor 200 may include a memory for storing LLR values and/or a memory for storing hard decisions.

Figure 4:
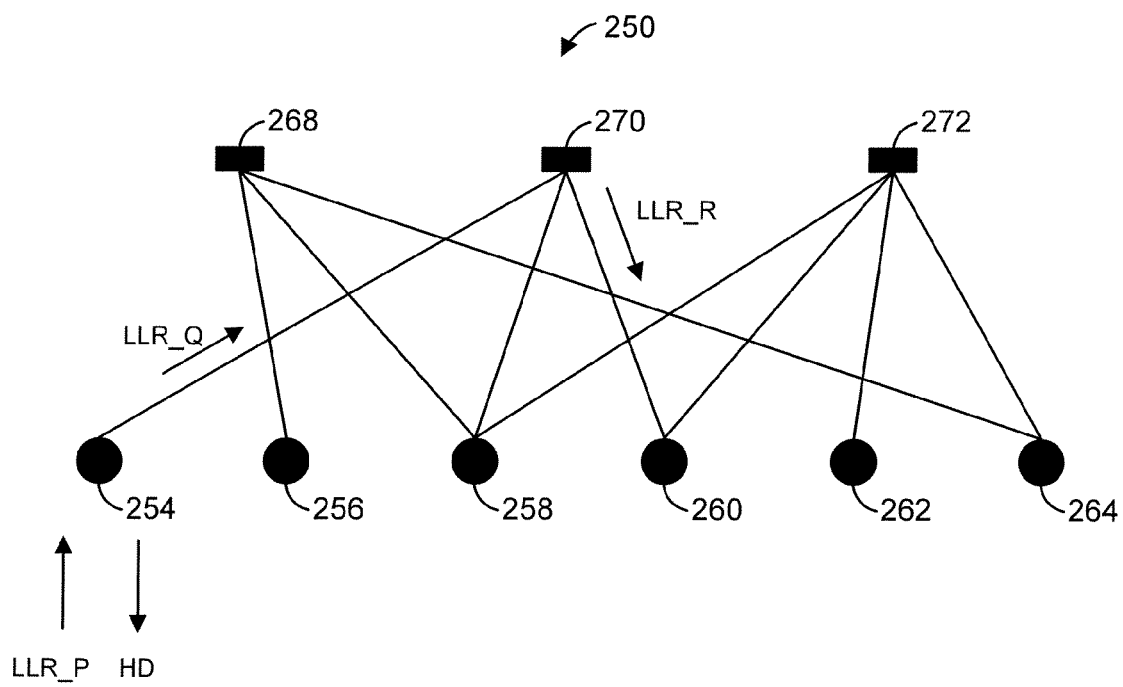
FIG. 4 is a graph fragment of an example LDPC code represented in a graph notation.

Operation of the LDPC decoder processor 200 will be described with reference to FIG. 4. FIG. 4 is a graph fragment 250 of an example LDPC code represented in a graph notation. The graph fragment 250 includes a plurality of bit nodes 254, 256, 258, 260, 262 and 264. Each of the bit nodes is connected to one or more check nodes 268, 270 and 272. The weight of a bit node is the number of check nodes to which it is connected. For example, the bit node 254 has a weight of one while the bit node 258 has a weight of 3. Similarly, the weight of a check node is the number of bit nodes to which it is connected.

The bit nodes 254, 256, 258, 260, 262 and 264 correspond to bits of a valid message, where each bit node corresponds to one of the valid bits. Bit nodes that are connected to a common check node indicate that the message bits corresponding to the bit nodes must have even parity (e.g., the sum of the bits, modulo two, must be zero). Thus, for example, valid message bits corresponding to bit nodes 254, 258 and 260 must sum, modulo two, to zero. The LDPC code of FIG. 4 also may be represented by parity-check equations:

$$x0+x1+x2+x3=0 \qquad \text{Equ. 1}$$

$$x2+x3+x5=0 \qquad \text{Equ. 2}$$

$$x0+x3+x4=0 \qquad \text{Equ. 3}$$

where x0, x1, x2, x3, x4 and x5 correspond to the message bits (right to left in FIG. 3). The parity-check equations 1, 2 and 3 also may be represented by a parity-check matrix H:

$$H = \begin{pmatrix} 1 & 1 & 1 & 1 & 0 & 0 \\ 0 & 0 & 1 & 1 & 0 & 1 \\ 1 & 0 & 0 & 1 & 1 & 0 \end{pmatrix} \quad \text{Equ. 4}$$

where each row represents one of the parity-check constraints and each column corresponds to one of the message bits.

When message bits are corrupted by the channel, the parity-check equations may be used to solve for the original message bits. Solving these equations may be accomplished by an iterative process that may include belief propagation, simplified approximations of belief propagation, the Min-Sum algorithm, etc. The iterative process may stop once a set of valid message bits (e.g., a codeword) is found or once a specified number of iterations, a specified time period, etc. has elapsed.

In iterative processes for solving the parity-check equations, each of the bit nodes 254, 256, 258, 260, 262 and 264 and each of the check nodes 268, 270 and 272 can be thought of as an element that performs one or more functions. For example, each bit node can be thought of as generating, during each iteration, a value LLR_Q for each check node to which it is connected. The LLR_Q values are generated based on a value LLR_P, which is the LLR value corresponding to the message bit for that bit node, and LLR_R values, which are values generated by the check nodes to which it is connected. Also, the bit node may generate a hard decision based on LLR_P and the LLR_R values. Similarly, each check node can be thought of as generating, during each iteration, a value LLR_R for each bit node to which it is connected. The LLR_R values are generated based on LLR_Q values, which are generated by the bit nodes to which it is connected. Further, the check node may generate a syndrome based on the hard decisions determined by the bit nodes.

Referring again to FIG. 3, the functions performed by the bit nodes and the check nodes during the iterative process may be implemented by the bit node PS 204 and the check node PS 208. In particular, the functions performed by the bit nodes may be implemented by the bit node PS 204, and the functions performed by the check nodes may be implemented by the check node PS 208. Additionally, the LLR_Q values and the LLR_R values may be passed between the bit node PS 204 and the check node PS 208 via the memory system 212. For example, after the bit node PS 204 generates an LLR_Q value, it may be stored in the memory system 212. Subsequently, the check node PS 208 may retrieve the LLR_Q value to use it for generating an LLR_R value. Then, the check node PS 208 may store the LLR_R value in the memory system 212 for subsequent use by the bit node PS 204. Also, the check node PS 208 may generate a syndrome based on hard decisions generated by the bit node PS 204. The syndrome may be used to determine if the iterative process should be ended. For example, if the syndrome is zero it may be determined that the codeword has been decoded. Each of the bit node PS 204 and the check node PS 208 may include a plurality of processing elements operating in parallel to help improve throughput of the LDPC decoder processor 200.

Figure 5:
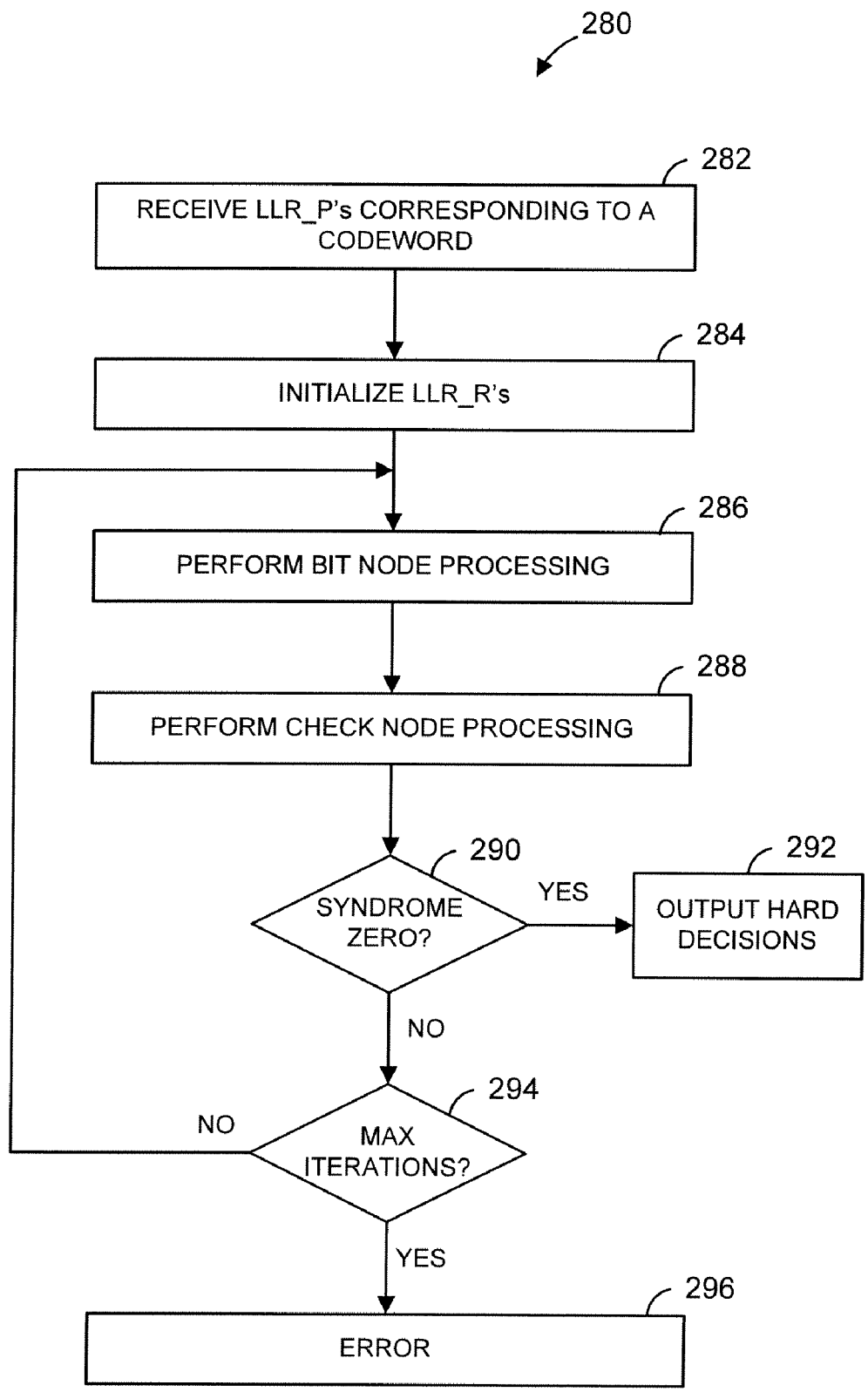
FIG. 5 is a flow diagram of an example method for decoding an LDPC code.

FIG. 5 is a flow diagram of an example method 280 that may be implemented by the LDPC decoder processor 200 of FIG. 3 and will be described with reference to FIG. 3. Of course, the method 280 may be implemented by systems other than the LDPC decoder processor 200. Similarly, the LDPC decoder processor 200 may implement methods different than the method 280.

At a block 282, a plurality of LLR values (LLR_P's) may be received. At a block 284, check node to bit node messages (LLR_R's) may be initialized to zero, for example. Then, at a block 286, bit node processing functions may be performed. For example, bit node to check node messages (LLR_Q's) may be calculated and stored. Also, hard decisions may be calculated. The bit node PS 204 may calculate the LLR_Q's and store them in the memory system 212. Also, the bit node PS 204 may calculate the hard decisions.

At a block 288, check node processing functions may be performed. For example, check node to bit node messages (LLR_R's) may be calculated and stored. Also, a syndrome may be calculated. The check node PS 208 may calculate the LLR_R's and store them in the memory system 212. Also, the check node PS 208 may calculate the syndrome.

At a block 290, it may be determined whether the syndrome calculated at the block 288 is zero. If the syndrome is zero, at a block 292, the hard decisions calculated at the block 286 may be output and the decoding for the codeword is completed with no errors. On the other hand, if the syndrome is not zero, the flow may proceed to a block 294. At the block 294, it may be determined whether a maximum number of iterations has been reached. If the maximum number has not yet been reached, the flow may proceed back to the block 286 to proceed with another iteration. On the other hand, if the maximum number was reached, the flow may proceed to the block 296 at which the decoding terminates with an error.

Figure 6:
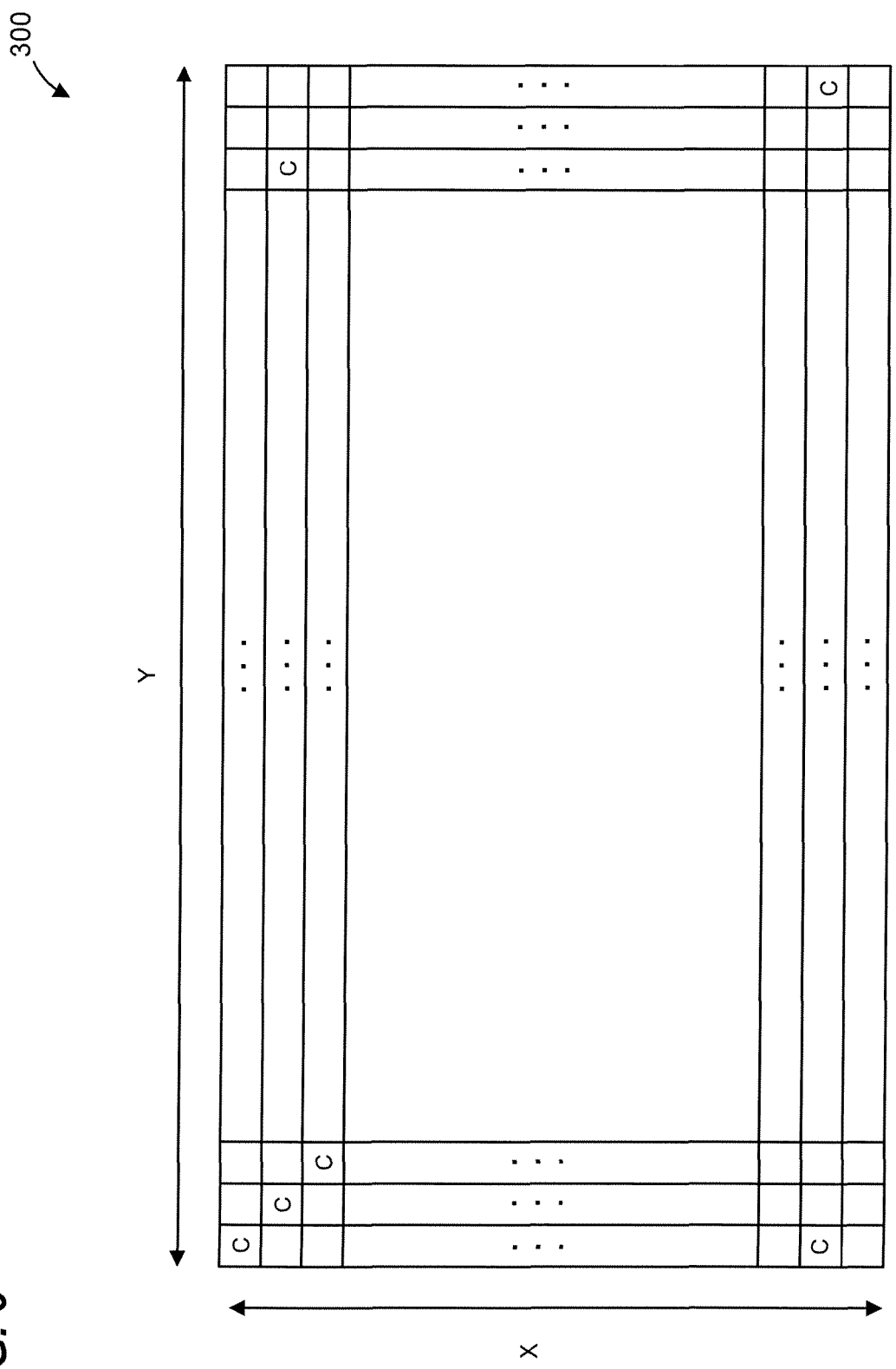
FIG. 6 is a diagram of an example mother parity-check matrix for an LDPC code.

As discussed above, the bit node PS 204 and the check node PS 208 of FIG. 3 may each include a plurality of processing elements operating in parallel. For example, the bit node PS 204 may comprise a plurality of bit node processing elements (PEs), and the check node PS 208 may comprise a plurality of check node PEs. FIG. 6 is a diagram of an example mother parity-check matrix 300 for an LDPC code and will be used to illustrate an example allocation of PEs for an LDPC decoder processor configured for the LDPC code corresponding to the matrix 300, which is a sparse matrix. In FIG. 6, each illustrated element of the mother matrix 300 is a square sub-matrix. Most of the sub-matrices are zero matrices. The remaining sub-matrices are circulant matrices, which are indicated in FIG. 6 as "C". One or more of the circulant matrices is not a true circulant, but may be referred to as a pseudo-circulant matrix D:

$$D = \begin{bmatrix} 0 & 0 & 0 & 0 & 0 & \ldots & 0 & 0 \\ 1 & 0 & 0 & 0 & 0 & \ldots & 0 & 0 \\ 0 & 1 & 0 & 0 & 0 & \ldots & 0 & 0 \\ 0 & 0 & 1 & 0 & 0 & \ldots & 0 & 0 \\ 0 & 0 & 0 & 1 & \ldots & \ldots & 0 & 0 \\ \ldots & \ldots & \ldots & \ldots & \ldots & \ldots & 0 & 0 \\ 0 & 0 & 0 & 0 & 0 & \ldots & 0 & 0 \\ 0 & 0 & 0 & 0 & 0 & \ldots & 1 & 0 \end{bmatrix} \quad \text{Equ. 5}$$

The mother matrix 300 may include a number Z of circulants, where the term circulant as used herein is meant to include both true circulant matrices and pseudo-circulant matrices (Equ. 5).

The mother matrix includes a number X of block rows and a number Y of block columns. In this example, there may be one bit node PE per block column and one check node PE per block row. Additionally, there may be one memory block for each circulant. Thus, for the example mother matrix 300, there may be Y bit node PEs and X check node PEs. Additionally, there may be a Z memory blocks used to pass messages between the Y bit node PEs and X check node PEs. Referring again to FIG. 3, if the LDPC decoder processor 200 is to operate with the LDPC code corresponding to the matrix 300, the bit node PS 204 may comprise Y bit node PEs, the check node PS 208 may comprise X check node PEs, and the memory system 212 may comprise Z memory blocks.

Figure 7:
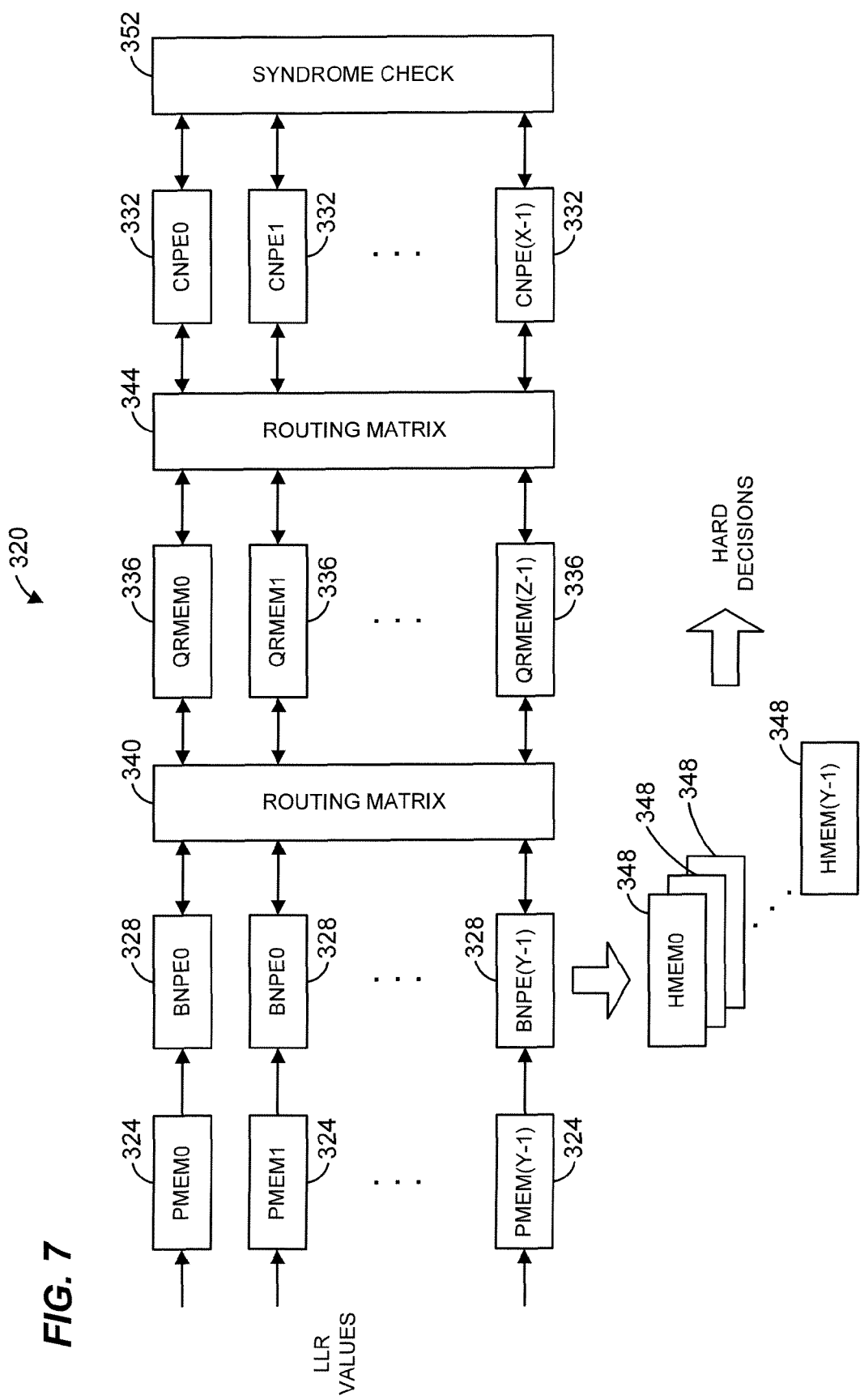
FIG. 7 is a block diagram of an example LDPC decoder processor.

FIG. 7 is a block diagram of an example LDPC decoder processor 320 that may be used with an LDPC sparse mother matrix such as the example matrix 300 of FIG. 6. The LDPC decoder processor 320 is one implementation of the LDPC decoder processor 200 of FIG. 3. Of course, the LDPC decoder processor 200 may be implemented differently than shown in FIG. 7.

The LDPC decoder processor 320 includes Y memory blocks 324 for storing LLR values to be decoded. If the LDPC decoder processor 320 is implemented on a field programmable gate array (FPGA), the memory blocks 324 may comprise distributed memories. If the processor 166 of FIG. 2 utilizes the LDPC decoder processor 320, the memory blocks 324 may be implemented as the input buffer 158 and/or the input buffer 160. Alternatively, the memory blocks 324 may be separate from the input buffer 158 and/or the input buffer 160. Additionally, the LDPC decoder processor 320 includes Y bit node processing elements 328 and X check node processing elements 332. Each bit node processing element 328 corresponds to one of the block columns of the sparse mother matrix, and each check node processing element 332 corresponds to one of the block rows of the sparse mother matrix. Each bit node processing element 328 is coupled to a memory block 324.

Further, the LDPC decoder processor 320 includes Z memory blocks 336. Each memory block 336 corresponds to one of the circulants of the mother matrix. Thus, each memory block 336 corresponds to one of the bit node processing elements 328 and one of the check node processing elements 332. The memory block 336 corresponding to one of the bit node processing elements 328 and one of the check node processing elements 332 is used by the one bit node processing element 328 and the one check node processing element 332 to pass LLR_Q and LLR_R messages. Of course, a bit node processing element 328 may correspond to multiple memory blocks 336. Similarly, a check node processing element 332 may correspond to multiple memory blocks 336.

A routing matrix 340 couples each bit node processing element 328 to one or more corresponding memory blocks 336. In one implementation, the routing matrix 340 couples each memory block 336 to at most one corresponding bit node processing element 328. Similarly, a routing matrix 344 couples each check node processing element 332 to one or more corresponding memory blocks 336. In one implementation, the routing matrix 344 couples each memory block 336 to at most one corresponding check node processing element 332. This permits the bit node processing elements 328 and the check node processing elements 332 to pass LLR_Q and LLR_R messages via the memory blocks 336. The particular configuration of the routing matrix 340 and the routing matrix 344 depends on the particular LDPC coding mother matrix that is to be utilized. If the LDPC decoder processor 320 is implemented as an FPGA, for example, the routing matrix 340 and the routing matrix 344 may be configured using an automated script. Each of the routing matrix 340 and the routing matrix 344 may be implemented in a variety of ways such as a re-configurable routing matrix, a cross-bar switch, a switch matrix, etc.

The LDPC decoder processor 320 also includes Y memory blocks 348 for storing hard decisions calculated by the bit node processing elements 328. Each memory block 348 is coupled to a corresponding one of the bit node processing elements 328. If the LDPC decoder processor 320 is implemented on an FPGA, the memory blocks 348 may comprise distributed memories. If the processor 166 of FIG. 2 utilizes the LDPC decoder processor 320, the memory blocks 348 may be implemented as the output buffer 170 and/or the output buffer 172. Alternatively, the memory blocks 348 may be separate from the output buffer 170 and/or the output buffer 172. Additionally, the hard decisions calculated by the bit node processing elements 328 may be passed to the check node processing elements 332 via the memory blocks 336 so that the check node processing elements 332 can perform a parity check on the hard decisions.

The LDPC decoder processor 320 further includes a syndrome check block 352 coupled to the check node processing elements 332. The syndrome check block 352 analyzes the syndrome generated by the check node processing elements 332 and determines whether the syndrome indicates a valid codeword has been obtained (e.g., checks that the syndrome is zero).

Each of the bit node processing elements 328 may include multiple bit node processing sub-elements, and the number of such elements may depend on the degree of parallelization needed or desired. In general, each bit node processing element 328 may include as little as one bit node processing sub-element and as many as a number corresponding to the size of the circulants used in the mother matrix. For example, if the circulant size is 512×512, as many as 512 sub-elements may be utilized. Of course, the bit node processing elements 328 need not be implemented as multiple sub-elements. Generally, as the number of sub-elements increases, the throughput capacity is increased at the expense of increased chip area. Hereinafter, both bit node processing elements and bit node processing sub-elements are referred to as a bit node processing elements.

Similarly, each of the check node processing elements 332 may include multiple check node processing sub-elements, and the number of such elements may depend on the degree of parallelization needed or desired. In general, each check node processing element 332 may include as little as one check node processing sub-element and as many as a number corresponding to the size of the circulants used in the mother matrix. For example, if the circulant size is 512×512, as many as 512 sub-elements may be utilized. Of course, the check node processing elements 332 need not be implemented as sub-elements. Generally, as the number of sub-elements increases, the throughput capacity is increased at the expense of increased chip area. Hereinafter, both check node processing elements and check node processing sub-elements are referred to as a check node processing elements.

Different bit node processing elements corresponding to different weights may be utilized. Also, in implementations that utilize the Min-Sum algorithm, scaling may be utilized. Table 1 provides example scaling factors that can be used. Of course, scaling factors other than those in Table 1 may be utilized, and the scaling factors may depend on the particular implementation and various factors such as desired performance, the particular LDPC code, etc.

TABLE 1

| WEIGHT | SCALING FACTOR | NUMBER OF ADDERS NEEDED TO SCALE |
|---|---|---|
| 2 | 14/16 ((16 − 2)/16) | 1 |
| 3, 4 | 13/16 (8 + 4 + 1)/16) | 2 |
| 5, 6, 7, 8, 9 | 12/16 ((8 + 4)/16) | 1 |
| 10 | 11/16 (8 + 2 + 1)/16) | 2 |
| 14, 15 | 8/16 | 0 |

Table 1 also indicates the number of adders that may be utilized to implement the corresponding scaling factor. Of course, weights other than those listed in Table 1 may be utilized, and the weights will depend on the particular LDPC code that is implemented.

Example bit node processing elements corresponding to different weights will now be described. Of course, weights other than those corresponding to the following examples may be utilized, with correspondingly different bit node processing elements. Each of the bit node processing elements generates LLR_Q values according to:

$$LLR\_Qi = \sum_{k \neq i} LLR\_Rk + LLR\_P \qquad \text{Equ. 6}$$

for i=0, . . . , w−1 and k=0, . . . , w−1, k≠i, where w is the weight associated with the bit node processing element. Also, each of the bit node processing elements or sub-elements generates a hard decision (HD) according to:

$$HD = \sum_{k=0}^{w-1} LLR\_Rk + LLR\_P \qquad \text{Equ. 7}$$

In one example implementation of the bit node processing elements, 6-bit word precision is used for the LLR_P, LLR_Q and LLR_R values. Of course, a different word precision may be utilized such as a precision less than 6-bits or more than 6-bits.

In the examples to be described, intermediate storage elements (e.g., latches, registers, etc.) are not illustrated for ease of explanation. One of ordinary skill in the art will recognize that intermediate storage elements optionally may be included in bit node processing elements, such as a storage element to store the output of a multiplier, a storage element to store the output of an adder, a storage element to store an input to the bit node processing element, a storage element to store an output generated by the bit node processing element, etc.

Figure 8:
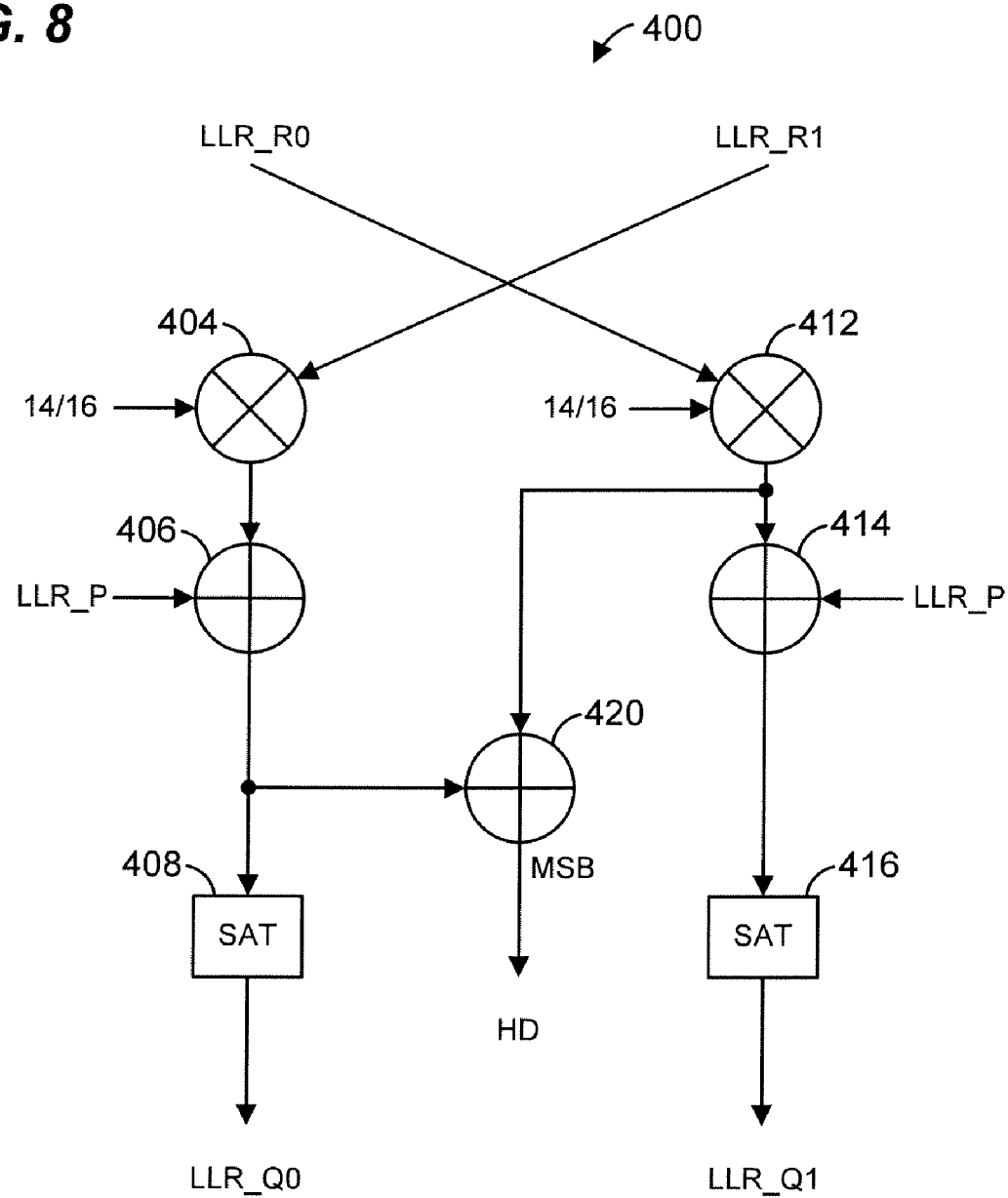
FIG. 8 is a block diagram of an example weight-two bit node processing element that may be utilized in the LDPC decoder processor of FIG. 7.

FIG. 8 is a block diagram of an example weight-two bit node processing element 400. Referring to FIG. 7, one or more of the bit node processing elements 328 may include the weight-two bit node processing element 400, and FIG. 8 will be described with reference to FIG. 7 for ease of explanation. Of course, none of the bit node processing elements 328 need include the weight-two bit node processing element 400. Similarly, the weight-two bit node processing element 400 may be utilized in LDPC decoder processors other than the LDPC decoder processor 320 of FIG. 7.

The weight-two bit node processing element 400 receives values LLR_P, LLR_R0, and LLR_R1, and generates values LLR_Q0, LLR_Q1, and a hard decision bit (HD). The LLR_P value may be received from one of the memory blocks 324. The LLR_R0 and LLR_R1 values may be received from one of the memory blocks 336. The LLR_Q0 and LLR_Q1 values may be written to the same memory block 336 from the LLR_R0 and LLR_R1 values were received.

A multiplier 404 multiplies the value LLR_R1 by a scaling factor 14/16 to generate a scaled LLR_R1 value. As discussed above, the multiplier 404 may be implemented using an adder. Additionally, the multiplier 404 optionally may include rounding logic. An adder 406 is coupled to an output of the multiplier 406. The adder 406 adds the scaled LLR_R1 value with an LLR_P value. In one implementation, the scaled LLR_R1 value and the LLR_P value are 6-bit precision values, and the output of the adder 406 is a 7-bit precision value. A saturation block 408 is coupled to the output of the adder 406. The saturation block 408 performs a saturation operation on the 7-bit precision value generated by the adder 406 to generate a 6-bit precision LLR_Q0 value. Thus, the weight-two bit node processing element 400 generally calculates the LLR_Q0 value as LLR_P plus a scaled LLR_R1.

A multiplier 412 multiplies the value LLR_R0 by the scaling factor 14/16 to generate a scaled LLR_R0 value. As discussed above, the multiplier 412 may be implemented using an adder. Additionally, the multiplier 412 optionally may include rounding logic. An adder 414 is coupled to an output of the multiplier 412. The adder 414 adds the scaled LLR_R0 value with the LLR_P value. In one implementation, the scaled LLR_R0 value and the LLR_P value are 6-bit precision values, and the output of the adder 414 is a 7-bit precision value. A saturation block 416 is coupled to the output of the adder 414. The saturation block 416 performs a saturation operation on the 7-bit precision value generated by the adder 414 to generate a 6-bit precision LLR_Q1 value. Thus, the weight-two bit node processing element 400 generally calculates the LLR_Q1 value as LLR_P plus a scaled LLR_R0.

An adder 420 is coupled to the output of the adder 406 and the output of the multiplier 412. The adder 420 generally calculates the sum of LLR_P, the scaled LLR_R0 and the scaled LLR_R1. The HD is taken as the most significant bit (MSB) from the sum calculated by the adder 420. Alternatively, the adder 420 may be coupled to the output of the adder 414 and the output of the multiplier 404.

Figure 9:
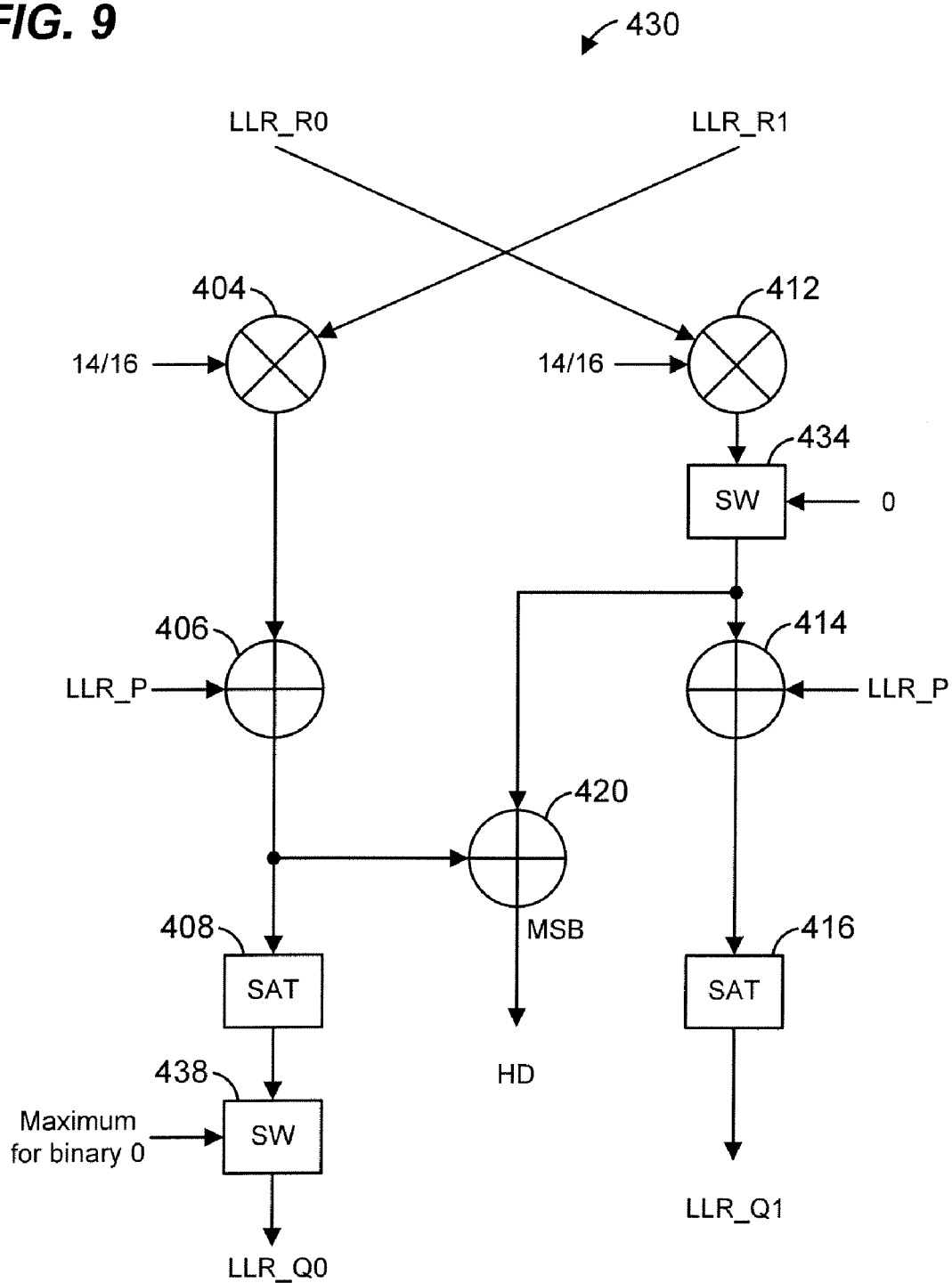
FIG. 9 is a block diagram of another example weight-two bit node processing element that may be utilized in the LDPC decoder processor of FIG. 7.

FIG. 9 is a block diagram of an example weight-two bit node processing element 430 that may be used in conjunction with the pseudo-circulant matrix D described above. Referring to FIG. 7, one or more of the bit node processing elements 328 may include the weight-two bit node processing element 430. Of course, none of the bit node processing elements 328 need include the weight-two bit node processing element 430. Similarly, the weight-two bit node processing element 430 may be utilized in LDPC decoder processors other than the LDPC decoder processor 320 of FIG. 7.

The weight-two bit node processing element 430 is similar to the weight-two bit node processing element 400 of FIG. 8, and like-numbered elements may be the same as or similar to the corresponding elements in FIG. 8. The weight-two bit node processing element 430 includes an intermediate switch element 434 coupled to the output of the multiplier 412 and the inputs of the adders 424 and 420. The switch element 434 either outputs the result of the multiplier 412 or a zero value. This facilitates the weight-two bit node processing element 430 operating with the all-zero row and column of the pseudo-circulant matrix D. As merely one example, the switch element 434 may comprise a storage element that either stores the output of the multiplier 412 or a zero value.

The weight-two bit node processing element 430 also includes an intermediate switch element 438 coupled to the output of the saturation block 408. The switch element 438 either outputs the result of the saturation block 408 or a maximum value corresponding to a binary zero. This facilitates the weight-two bit node processing element 430 operating with the all-zero row and column of the pseudo-circulant matrix D. As merely one example, the switch element 438 may comprise a storage element that either stores the output of the saturation block 408 or a maximum value corresponding to a binary zero.

As an alternative, the storage element 434 could be coupled between the multiplier 404 and the adder 406, and the storage element 438 could be coupled to the output of the saturation block 416.

Figure 10:
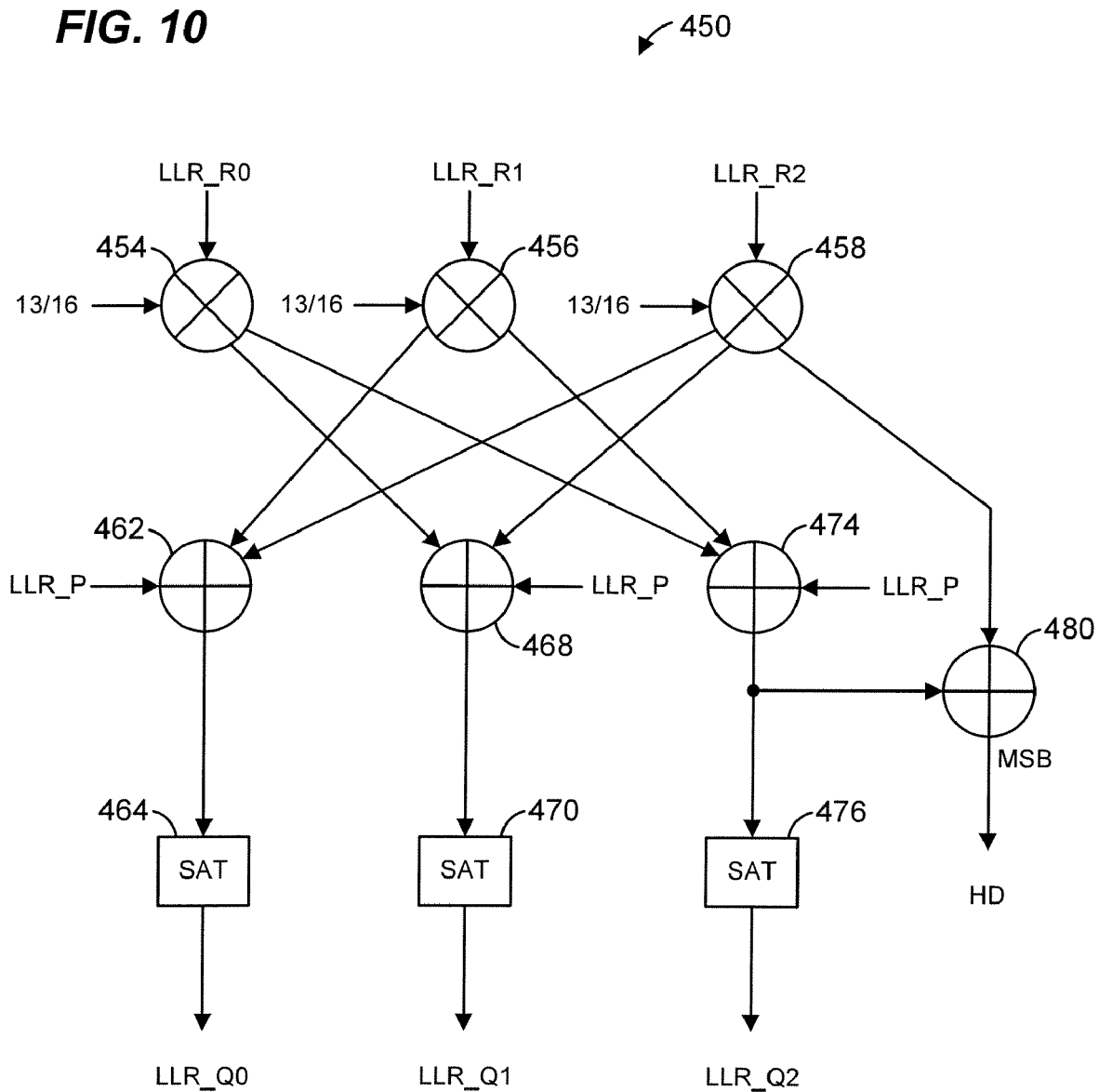
FIG. 10 is a block diagram of an example weight-three bit node processing element that may be utilized in the LDPC decoder processor of FIG. 7.

FIG. 10 is a block diagram of an example weight-three bit node processing element 450. Referring to FIG. 7, one or more of the bit node processing elements 328 may include the weight-three bit node processing element 450, and FIG. 10 will be described with reference to FIG. 7 for ease of explanation. Of course, none of the bit node processing elements 328 need include the weight-three bit node processing element 450. Similarly, the weight-three bit node processing element 450 may be utilized in LDPC decoder processors other than the LDPC decoder processor 320 of FIG. 7.

The weight-three bit node processing element 450 receives values LLR_P, LLR_R0, LLR_R1 and LLR_R2, and generates values LLR_Q0, LLR_Q1, LLR_Q2 and a HD. The LLR_P value may be received from one of the memory blocks 324. The LLR_R0, LLR_R1 and LLR_R2 values may be received from one of the memory blocks 336. The LLR_Q0, LLR_Q1 and LLR_Q2 values may be written to the same memory block 336 from the LLR_R0, LLR_R1 and LLR_R2 values were received.

A multiplier 454 multiplies the value LLR_R0 by a scaling factor 13/16 to generate a scaled LLR_R0 value. A multiplier 456 multiplies the value LLR_R1 by the scaling factor 13/16 to generate a scaled LLR_R1 value. A multiplier 458 multiplies the value LLR_R2 by the scaling factor 13/16 to generate a scaled LLR_R2 value. As discussed above, each of the multipliers 454, 456 and 458 may be implemented using two adders. Additionally, each of the multipliers 454, 456 and 458 optionally may include rounding logic.

An adder 462 is coupled to an output of the multiplier 456 and an output of the multiplier 458. The adder 462 sums the scaled LLR_R1 and LLR_R2 values and an LLR_P value. In one implementation, the scaled LLR_R1 and LLR_R2 values and the LLR_P value are 6-bit precision values, and the output of the adder 462 is an 8-bit precision value. A saturation block 464 is coupled to the output of the adder 462. The saturation block 464 performs a saturation operation on the 8-bit precision value generated by the adder 462 to generate a 6-bit precision LLR_Q0 value. Thus, the weight-three bit node processing element 450 generally calculates the LLR_Q0 value as the sum of the LLR_P, a scaled LLR_R1 and a scaled LLR_R2.

An adder 468 is coupled to an output of the multiplier 454 and the output of the multiplier 458. The adder 468 sums the scaled LLR_R0 and LLR_R2 values and the LLR_P value. In one implementation, the scaled LLR_R0 and LLR_R2 values and the LLR_P value are 6-bit precision values, and the output of the adder 468 is an 8-bit precision value. A saturation block 470 is coupled to the output of the adder 468. The saturation block 470 performs a saturation operation on the 8-bit precision value generated by the adder 468 to generate a 6-bit precision LLR_Q1 value. Thus, the weight-three bit node processing element 450 generally calculates the LLR_Q1 value as the sum of the LLR_P, a scaled LLR_R0 and a scaled LLR_R2.

An adder 474 is coupled to the output of the multiplier 454 and the output of the multiplier 456. The adder 474 sums the scaled LLR_R0 and LLR_R1 values and the LLR_P value. In one implementation, the scaled LLR_R0 and LLR_R1 values and the LLR_P value are 6-bit precision values, and the output of the adder 474 is an 8-bit precision value. A saturation block 476 is coupled to the output of the adder 474. The saturation block 476 performs a saturation operation on the 8-bit precision value generated by the adder 474 to generate a 6-bit precision LLR_Q2 value. Thus, the weight-three bit node processing element 450 generally calculates the LLR_Q2 value as the sum of the LLR_P, a scaled LLR_R0 and a scaled LLR_R1.

An adder 480 is coupled to the output of the adder 474 and the output of the multiplier 458. The adder 480 generally calculates the sum of LLR_P, the scaled LLR_R0, the scaled LLR_R1 and the scaled LLR_R2. The HD is taken as the MSB from the sum calculated by the adder 480. Alternatively, the adder 480 may be coupled to the output of the adder 462 and the output of the multiplier 454. As another alternative, the adder 480 may be coupled to the output of the adder 468 and the output of the multiplier 456.

Figure 11:
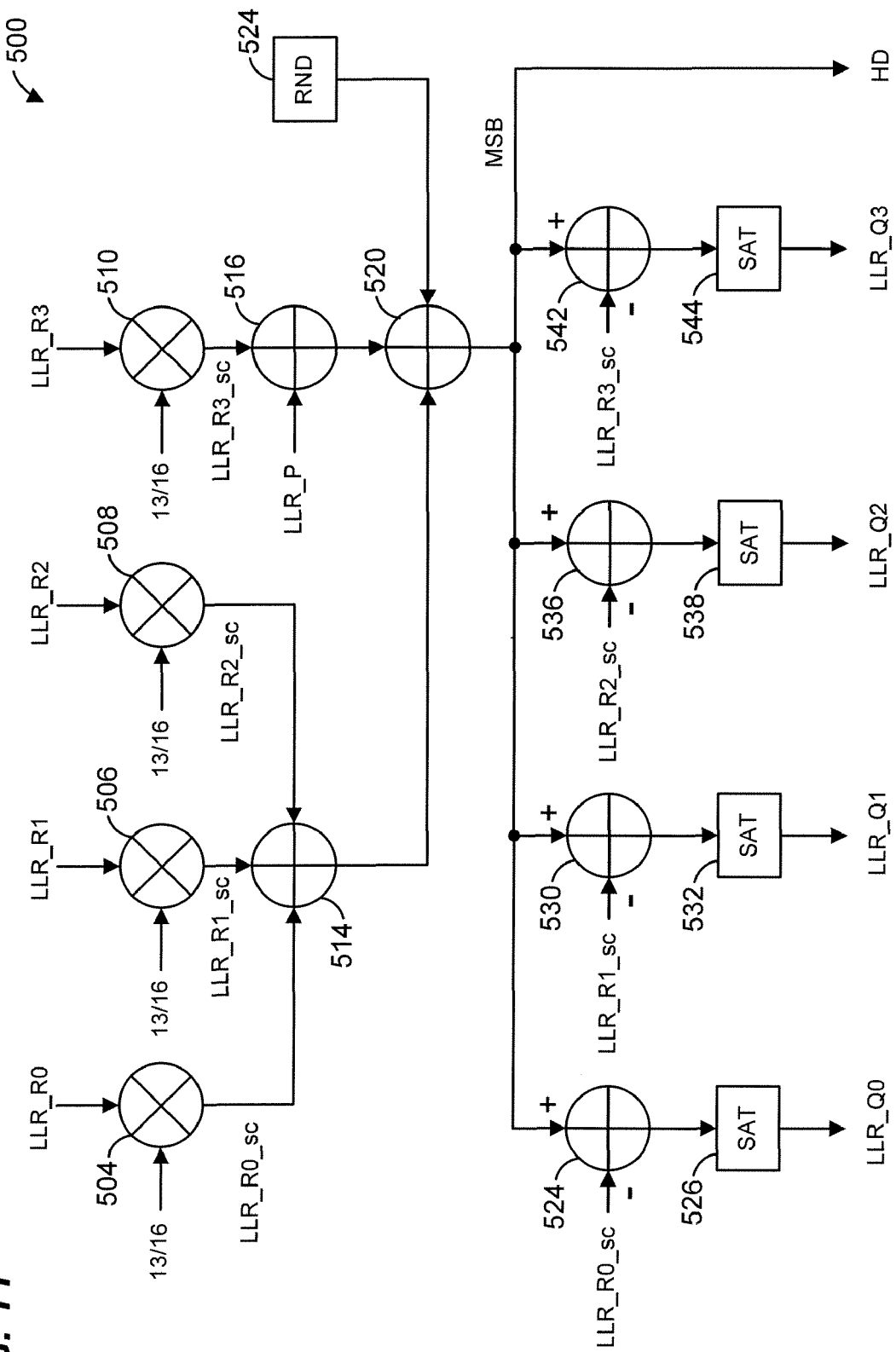
FIG. 11 is a block diagram of an example weight-four bit node processing element that may be utilized in the LDPC decoder processor of FIG. 7.

FIG. 11 is a block diagram of an example weight-four bit node processing element 500. Referring to FIG. 7, one or more of the bit node processing elements 328 may include the weight-four bit node processing element 500, and FIG. 11 will be described with reference to FIG. 7 for ease of explanation. Of course, none of the bit node processing elements 328 need include the weight-four bit node processing element 500. Similarly, the weight-four bit node processing element 500 may be utilized in LDPC decoder processors other than the LDPC decoder processor 320 of FIG. 7.

The weight-four bit node processing element 500 receives values LLR_P, LLR_R0, LLR_R1, LLR_R2 and LLR_R3, and generates values LLR_Q0, LLR_Q1, LLR_Q2, LLR_Q3 and a I-ID. The LLR_P value may be received from one of the memory blocks 324. The LLR_R0, LLR_R1, LLR_R2 and LLR_R3 values may be received from one of the memory blocks 336. The LLR_Q0, LLR_Q1, LLR_Q2 and LLR_Q3 values may be written to the same memory block 336 from the LLR_R0, LLR_R1, LLR_R2 and LLR_R3 values were received.

A multiplier 504 multiplies the value LLR_R0 by a scaling factor 13/16 to generate a scaled LLR_R0 value. A multiplier 506 multiplies the value LLR_R1 by the scaling factor 13/16 to generate a scaled LLR_R1 value. A multiplier 508 multiplies the value LLR_R2 by the scaling factor 13/16 to generate a scaled LLR_R2 value. A multiplier 510 multiplies the value LLR_R3 by the scaling factor 13/16 to generate a scaled LLR_R3 value. As discussed above, each of the multipliers 504, 506, 508 and 510 may be implemented using two adders.

An adder 514 is coupled to an output of the multiplier 504, an output of the multiplier 506 and an output of the multiplier 508. The adder 514 sums the scaled LLR_R0, LLR_R1 and LLR_R2 values. In one implementation, the scaled LLR_R0, LLR_R1 and LLR_R2 values are 6-bit precision values, and the output of the adder 514 is an 8-bit precision value. An adder 516 is coupled to an output of the multiplier 510. The adder 516 sums the scaled LLR_R3 value and the LLR_P value. In one implementation, the scaled LLR_R3 value and the LLR_P value are 6-bit precision values, and the output of the adder 516 is an 8-bit precision value.

An adder 520 is coupled to an output of the adder 514 and an output of the adder 516. The adder 520 is also coupled to a rounding factor generator 524. The rounding factor generator 524 calculates a rounding factor as:

$$\text{Round} = \lfloor \text{Count}/2 + \tfrac{1}{2} \rfloor \qquad \text{Equ. 7}$$

where Count is the number of one-valued ½ least significant bits generated by the multipliers 504, 506, 508 and 510. The rounding factor generator 524 may be coupled to the multipliers 504, 506, 508 and 510 and may be configured to count the one-valued 1/2 least significant bits. Equation 7 subsequently will be described further. In one implementation, the output of the adder 520 is a 9-bit precision value. The output of the adder 520 generally is the sum of the scaled LLR_R0, LLR_R1, LLR_R2 and LLR_R3 values, the LLR_P value and the rounding factor.

A subtractor 524 subtracts the scaled LLR_R0 value from the output of the adder 520. A saturation block 526 is coupled to the output of the subtractor 524. The saturation block 526 performs a saturation operation on the 9-bit precision value generated by the subtractor 524 to generate a 6-bit precision LLR_Q0 value. Thus, the weight-four bit node processing element 500 generally calculates the LLR_Q0 value as the sum of the LLR_P, a scaled LLR_R1, a scaled LLR_R2 and a scaled LLR_R3.

A subtractor 530 subtracts the scaled LLR_R1 value from the output of the adder 520. A saturation block 532 is coupled to the output of the subtractor 530. The saturation block 532 performs a saturation operation on the 9-bit precision value generated by the subtractor 530 to generate a 6-bit precision LLR_Q1 value. Thus, the weight-four bit node processing element 500 generally calculates the LLR_Q1 value as the sum of the LLR_P, a scaled LLR_R0, a scaled LLR_R2 and a scaled LLR_R3.

A subtractor 536 subtracts the scaled LLR_R2 value from the output of the adder 520. A saturation block 538 is coupled to the output of the subtractor 536. The saturation block 538 performs a saturation operation on the 9-bit precision value generated by the subtractor 536 to generate a 6-bit precision LLR_Q2 value. Thus, the weight-four bit node processing element 500 generally calculates the LLR_Q2 value as the sum of the LLR_P, a scaled LLR_R0, a scaled LLR_R1 and a scaled LLR_R3.

A subtractor 542 subtracts the scaled LLR_R3 value from the output of the adder 520. A saturation block 544 is coupled to the output of the subtractor 542. The saturation block 544 performs a saturation operation on the 9-bit precision value generated by the subtractor 542 to generate a 6-bit precision LLR_Q3 value. Thus, the weight-four bit node processing element 500 generally calculates the LLR_Q3 value as the sum of the LLR_P, a scaled LLR_R0, a scaled LLR_R1 and a scaled LLR_R2.

The HD is taken as the MSB from the sum calculated by the adder 520.

Referring again to the block 524, the ½ factor in Equ. 7 may be computed as follows. First, a term 0.5*4*0.25−0.25 may be calculated, where the 0.5*4*0.25 factor is to compensate for the discarding, on average, of a ¼ least significant bit for each of the multipliers 504, 506, 508 and 510, and the 0.25 factor is to compensate for the discarding, on average, of a ½ least significant bit from the value that is subtracted at each of the subtractors 524, 530, 536 and 542. The value calculated is 0.25, which is then rounded to the nearest half least significant bit step, resulting in the ½ factor.

One of ordinary skill in the art will recognize many alternatives and/or modifications to the weight-four bit node processing element 500. As just one example, a different type of rounding scheme may be employed, or rounding may be omitted. As another example, the adder 514 could sum the scaled LLR_R0, LLR_R1 and LLR_R3 values, and the adder 516 could sum the LLR_P value with the scaled LLR_R2 value.

Figure 12:
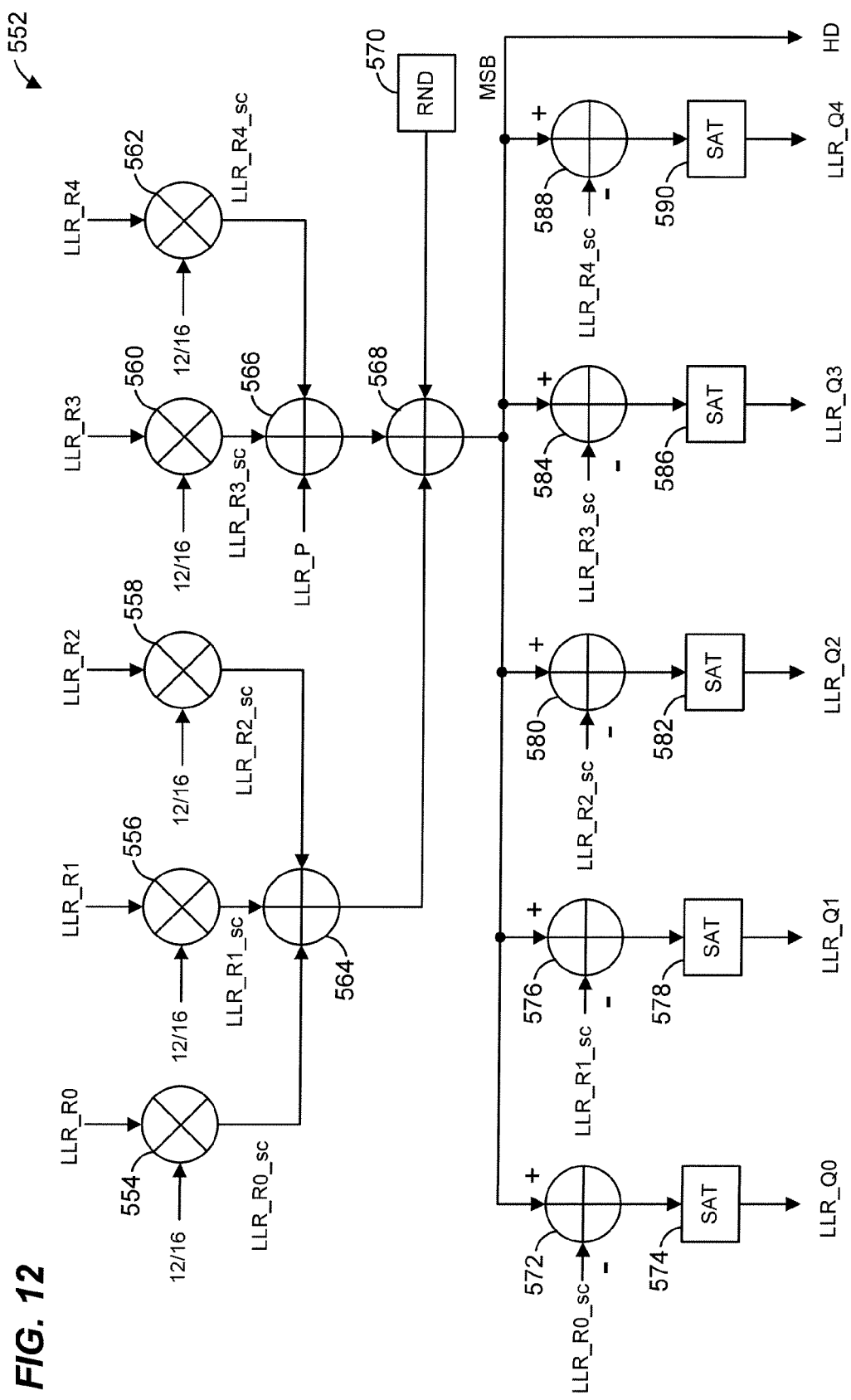
FIG. 12 is a block diagram of an example weight-five bit node processing element that may be utilized in the LDPC decoder processor of FIG. 7.

FIG. 12 is a block diagram of an example weight-five bit node processing element 552. Referring to FIG. 7, one or more of the bit node processing elements 328 may include the weight-five bit node processing element 552, and FIG. 12 will be described with reference to FIG. 7 for ease of explanation. Of course, none of the bit node processing elements 328 need include the weight-five bit node processing element 552. Similarly, the weight-five bit node processing element 552 may be utilized in LDPC decoder processors other than the LDPC decoder processor 320 of FIG. 7.

The weight-five bit node processing element 552 receives values LLR_P, LLR_R0, LLR_R1, LLR_R2, LLR_R3 and LLR_R4, and generates values LLR_Q0, LLR_Q1, LLR_Q2, LLR_Q3, LLR_Q4 and a HD. The LLR_P value may be received from one of the memory blocks 324. The LLR_R0, LLR_R1, LLR_R2, LLR_R3 and LLR_R4 values may be received from one of the memory blocks 336. The LLR_Q0, LLR_Q1, LLR_Q2, LLR_Q3 and LLR_Q4 values may be written to the same memory block 336 from the LLR_R0, LLR_R1, LLR_R2, LLR_R3 and LLR_R4 values were received.

A multiplier 554 multiplies the value LLR_R0 by a scaling factor 12/16 to generate a scaled LLR_R0 value. A multiplier 556 multiplies the value LLR_R1 by the scaling factor 12/16 to generate a scaled LLR_R1 value. A multiplier 558 multiplies the value LLR_R2 by the scaling factor 12/16 to generate a scaled LLR_R2 value. A multiplier 560 multiplies the value LLR_R3 by the scaling factor 12/16 to generate a scaled LLR_R3 value. A multiplier 562 multiplies the value LLR_R4 by the scaling factor 12/16 to generate a scaled LLR_R4 value. As discussed above, each of the multipliers 554, 556, 558 and 560 may be implemented using one adder.

An adder 564 is coupled to an output of the multiplier 554, an output of the multiplier 556 and an output of the multiplier 558. The adder 564 sums the scaled LLR_R0, LLR_R1 and LLR_R2 values. In one implementation, the scaled LLR_R0, LLR_R1 and LLR_R2 values are 6-bit precision values, and the output of the adder 564 is an 8-bit precision value. An adder 566 is coupled to an output of the multiplier 560 and an output of the multiplier 562. The adder 566 sums the scaled LLR_R3 value, the scaled LLR_R4 value and the LLR_P value. In one implementation, the scaled LLR_R3 value, the scaled LLR_R4 value and the LLR_P value are 6-bit precision values, and the output of the adder 566 is an 8-bit precision value.

An adder 568 is coupled to an output of the adder 564 and an output of the adder 566. The adder 568 is also coupled to a rounding factor generator 570. The rounding factor generator 570 calculates a rounding factor as:

$$\text{Round} = \lfloor \text{Count}/2 + \tfrac{1}{2} \rfloor \qquad \text{Equ. 8}$$

where Count is the number of ½ least significant bits generated by the multipliers 554, 556, 558, 560 and 562. The rounding factor generator 570 may be coupled to the multipliers 554, 556, 558, 560 and 562 and may be configured to count the one-valued ½ least significant bits. Equation 8 subsequently will be described further. In one implementation, the output of the adder 568 is a 9-bit precision value. The output of the adder 568 generally is the sum of the scaled LLR_R0, LLR_R1, LLR_R2, LLR_R3 and LLR_R4 values, the LLR_P value and the rounding factor.

A subtractor 572 subtracts the scaled LLR_R0 value from the output of the adder 568. A saturation block 526 is coupled to the output of the subtractor 524. The saturation block 574 performs a saturation operation on the 9-bit precision value generated by the subtractor 572 to generate a 6-bit precision LLR_Q0 value. Thus, the weight-five bit node processing element 552 generally calculates the LLR_Q0 value as the sum of the LLR_P, a scaled LLR_R1, a scaled LLR_R2, a scaled LLR_R3 and a scaled LLR_R4.

A subtractor 576 subtracts the scaled LLR_R1 value from the output of the adder 568. A saturation block 578 is coupled to the output of the subtractor 576. The saturation block 578 performs a saturation operation on the 9-bit precision value generated by the subtractor 576 to generate a 6-bit precision LLR_Q1 value. Thus, the weight-five bit node processing element 552 generally calculates the LLR_Q1 value as the sum of the LLR_P, a scaled LLR_R0, a scaled LLR_R2, a scaled LLR_R3 and a scaled LLR_R4.

A subtractor 580 subtracts the scaled LLR_R2 value from the output of the adder 568. A saturation block 582 is coupled to the output of the subtractor 580. The saturation block 582 performs a saturation operation on the 9-bit precision value generated by the subtractor 580 to generate a 6-bit precision LLR_Q2 value. Thus, the weight-five bit node processing element 552 generally calculates the LLR_Q2 value as the sum of the LLR_P, a scaled LLR_R0, a scaled LLR_R1, a scaled LLR_R3 and a scaled LLR_R4.

A subtractor 584 subtracts the scaled LLR_R3 value from the output of the adder 568. A saturation block 586 is coupled to the output of the subtractor 584. The saturation block 586 performs a saturation operation on the 9-bit precision value generated by the subtractor 584 to generate a 6-bit precision LLR_Q3 value. Thus, the weight-five bit node processing element 552 generally calculates the LLR_Q3 value as the sum of the LLR_P, a scaled LLR_R0, a scaled LLR_R1, a scaled LLR_R2 and a scaled LLR_R4.

A subtractor 588 subtracts the scaled LLR_R4 value from the output of the adder 568. A saturation block 590 is coupled to the output of the subtractor 588. The saturation block 590 performs a saturation operation on the 9-bit precision value generated by the subtractor 588 to generate a 6-bit precision LLR_Q4 value. Thus, the weight-five bit node processing element 552 generally calculates the LLR_Q4 value as the sum of the LLR_P, a scaled LLR_R0, a scaled LLR_R1, a scaled LLR_R2 and a scaled LLR_R3.

The HD is taken as the MSB from the sum calculated by the adder 568.

Referring again to the block 570, the ½ factor in Equ. 8 may be calculated from the expression 0.5*5*0.25−0.25, rounded to the nearest ½ least significant bit step, where the 0.5*5*0.25 factor is to compensate for the discarding, on average, of a ¼ A least significant bit for each of the multipliers 554, 556, 558, 560 and 562, and the 0.25 factor is to compensate for the discarding, on average, of a ½ least significant bit from the value that is subtracted at each of the subtractors 572, 576, 580, 584 and 588.

One of ordinary skill in the art will recognize many alternatives and/or modifications to the weight-five bit node processing element 552. As just one example, a different type of rounding scheme may be employed, or rounding may be omitted. As another example, the adder 564 could sum the scaled LLR_R0, LLR_R1 and LLR_R4 values, and the adder 566 could sum the LLR_P value, the scaled LLR_R2 value and the scaled LLR_R3 value.

Figure 13:
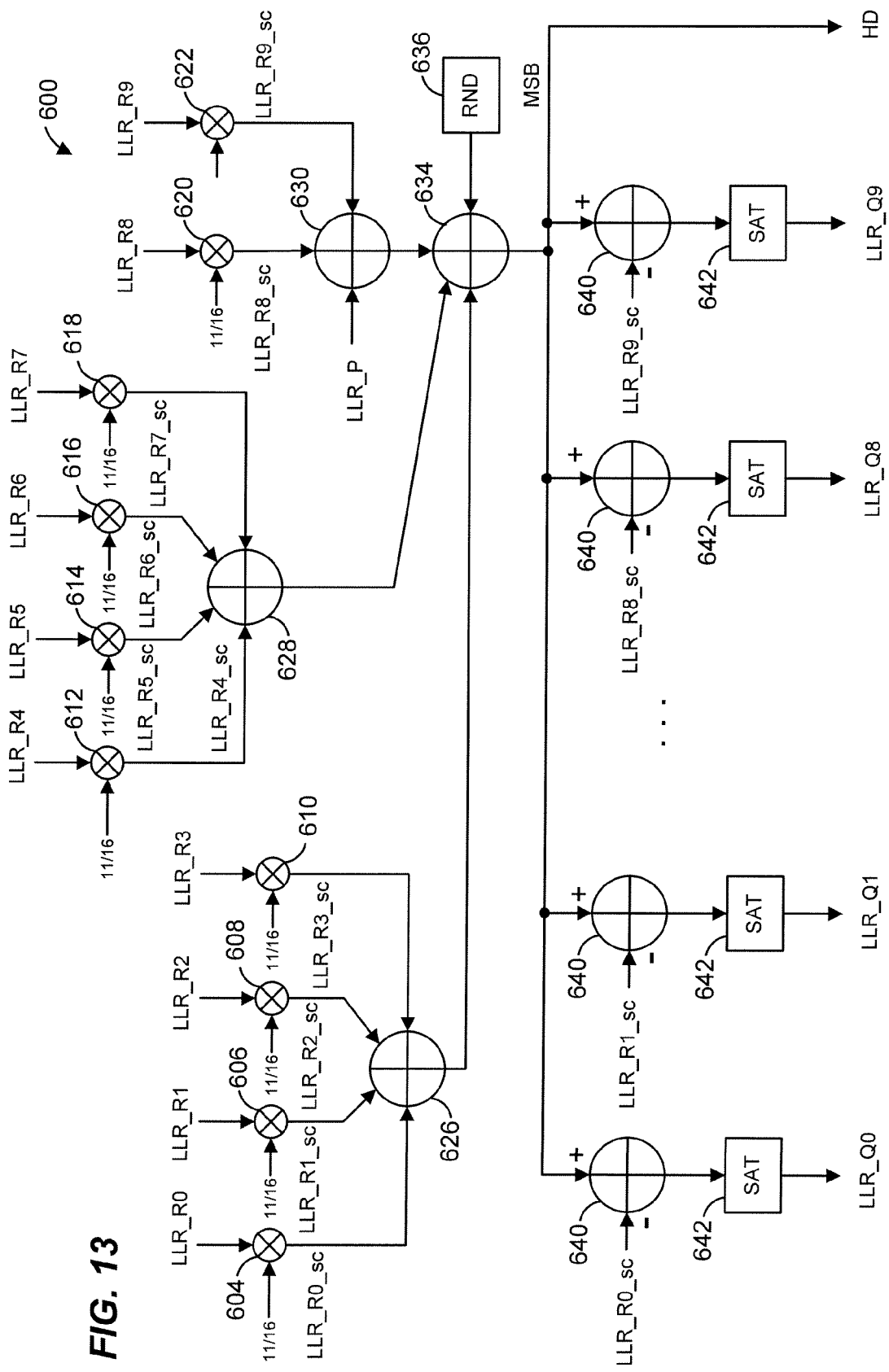
FIG. 13 is a block diagram of an example weight-ten bit node processing element that may be utilized in the LDPC decoder processor of FIG. 7.

FIG. 13 is a block diagram of an example weight-ten bit node processing element 600. Referring to FIG. 7, one or more of the bit node processing elements 328 may include the weight-ten bit node processing element 600, and FIG. 13 will be described with reference to FIG. 7 for ease of explanation. Of course, none of the bit node processing elements 328 need include the weight-ten bit node processing element 600. Similarly, the weight-ten bit node processing element 600 may be utilized in LDPC decoder processors other than the LDPC decoder processor 320 of FIG. 7.

The weight-ten bit node processing element 600 receives values LLR_P, LLR_R0, LLR_R1, ..., LLR_R9, and generates values LLR_Q0, LLR_Q1, ..., LLR_Q9 and a HD. The LLR_P value may be received from one of the memory blocks 324. The LLR_R0, LLR_R1, ..., LLR_R9 values may be received from one of the memory blocks 336. The LLR_Q0, LLR_Q1, ..., LLR_Q9 values may be written to the same memory block 336 from the LLR_R0, LLR_R1, ..., LLR_R9 values were received.

A multiplier 604 multiplies the value LLR_R0 by a scaling factor 11/16 to generate a scaled LLR_R0 value. A multiplier 606 multiplies the value LLR_R1 by the scaling factor 11/16 to generate a scaled LLR_R1 value. A multiplier 608 multiplies the value LLR_R2 by the scaling factor 11/16 to generate a scaled LLR_R2 value. A multiplier 610 multiplies the value LLR_R3 by the scaling factor 11/16 to generate a scaled LLR_R3 value. A multiplier 612 multiplies the value LLR_R4 by the scaling factor 11/16 to generate a scaled LLR_R4 value. A multiplier 614 multiplies the value LLR_R5 by a scaling factor 11/16 to generate a scaled LLR_R5 value. A multiplier 616 multiplies the value LLR_R6 by the scaling factor 11/16 to generate a scaled LLR_R6 value. A multiplier 618 multiplies the value LLR_R7 by the scaling factor 11/16 to generate a scaled LLR_R7 value. A multiplier 620 multiplies the value LLR_R8 by the scaling factor 11/16 to generate a scaled LLR_R8 value. A multiplier 622 multiplies the value LLR_R9 by the scaling factor 11/16 to generate a scaled LLR_R9 value. As discussed above, each of the multipliers 604, 606, 608, 610, 612, 614, 616, 618, 620 and 622 may be implemented using two adders.

An adder 626 is coupled to an output of the multiplier 604, an output of the multiplier 606, an output of the multiplier 608 and an output of the multiplier 610. The adder 626 sums the scaled LLR_R0, LLR_R1, LLR_R2 and LLR_R3 values. In one implementation, the scaled LLR_R0, LLR_R1, LLR_R2 and LLR_R3 values are 6-bit precision values, and the output of the adder 626 is an 8-bit precision value. An adder 628 is coupled to an output of the multiplier 612, an output of the multiplier 614, an output of the multiplier 616 and an output of the multiplier 618. The adder 628 sums the scaled LLR_R4, LLR_R5, LLR_R6 and LLR_R7 values. In one implementation, the scaled LLR_R4, LLR_R5, LLR_R6 and LLR_R7 values are 6-bit precision values, and the output of the adder 628 is an 8-bit precision value. An adder 630 is coupled to an output of the multiplier 620 and an output of the multiplier 622. The adder 630 sums the scaled LLR_R8 value, the scaled LLR_R9 value and the LLR_P value. In one implementation, the scaled LLR_R8 value, the scaled LLR_R9 value and the LLR_P value are 6-bit precision values, and the output of the adder 630 is an 8-bit precision value.

An adder 634 is coupled to an output of the adder 626, an output of the adder 628 and an output of the adder 630. The adder 634 is also coupled to a rounding factor generator 636. The rounding factor generator 636 calculates a rounding factor as:

$$\text{Round} = \lfloor \text{Count}/2 + 1 \rfloor \qquad \text{Equ. 9}$$

where Count is the number of ½ least significant bits generated by the multipliers 604, 606, 608, 610, 612, 614, 616, 618, 620 and 622. The rounding factor generator 636 may be coupled to the multipliers 604, 606, 608, 610, 612, 614, 616, 618, 620 and 622 and may be configured to count the one-valued ½ least significant bits. Equation 9 subsequently will be described further. In one implementation, the output of the adder 634 is a 10-bit precision value. The output of the adder 634 generally is the sum of the scaled LLR_R0, LLR_R1, . . . , LLR_R9 values, the LLR_P value and the rounding factor.

The weight-ten bit node processing element 600 also includes a plurality of subtractors 640 coupled to respective saturation blocks 642. Each subtractor subtracts a corresponding scaled LLR_Ri value from the output of the adder 634. The corresponding saturation block 642 performs a saturation operation on the 10-bit precision value generated by the subtractor 640 to generate a corresponding 6-bit precision LLR_Qi value.

The HD is taken as the MSB from the sum calculated by the adder 634.

Referring again to the block 636, the 1 factor in Equ. 9 may be calculated from the expression 0.5*10*0.25−0.25, rounded to the nearest ½ least significant bit step, where the 0.5*10*0.25 factor is to compensate for the discarding, on average, of a ¼ least significant bit for each of the multipliers 604, 606, 608, 610, 612, 614, 616, 618, 620 and 622, and the 0.25 factor is to compensate for the discarding, on average, of a ½ least significant bit from the value that is subtracted at each of the subtractors 640.

One of ordinary skill in the art will recognize many alternatives and/or modifications to the weight-ten bit node processing element 600. As just one example, a different type of rounding scheme may be employed, or rounding may be omitted. As another example, the adder 628 could sum the scaled LLR_R4, LLR_R5, LLR_R8 and LLR_R9 values, and the adder 630 could sum the LLR_P value, the scaled LLR_R6 value and the scaled LLR_R7 value.

Referring now to check nodes, different check node processing elements corresponding to different weights may be utilized. In one particular LDPC code, weights of seven and eight may be utilized. Of course, different LDPC codes may utilize different weights. In general, a check node processing element determines the minimum LLR_Qi value that it receives as well as the second minimum LLR_Qi value, for i=0, . . . , w−1. For each LLR_Rk, for k=0, . . . , w−1, it assigns it a new value according to the following rule:

1) For each LLR_Rk value that does not correspond to the edge with the minimum LLR_Qi, set the magnitude of LLR_Rk value to the magnitude of the minimum LLR_Qi;

2) For the LLR_Rk value that corresponds to the edge with the minimum LLR_Qi, set the magnitude of the LLR_Rk value to the magnitude of the second minimum LLR_Qi;

3) Determine parity of the LLR_Qs;

4) If the parity is even, set the sign of each LLR_Rk value to the sign of the corresponding LLR_Qi value;

5) If the parity is odd, set the sign of each LLR_Rk value to the opposite of the sign of the corresponding LLR_Qi value.

An example check node operation for a weight four check node processing element will be described to illustrate the operation of check nodes. Say, for example, the check node processing element receives the following LLR_Q values: LLR_Q0=6, LLR_Q1=5, LLR_Q2=−4, and LLR_Q3=3. Then, the minimum magnitude of the LLR_Q values is 3 and the second minimum is 4. Also, the parity of the LLR_Q values is odd. Thus, the LLR_R values are set as: LLR_R0=−3, LLR_R1=−3, LLR_R2=3 and LLR_R3=−4.

Figure 14:
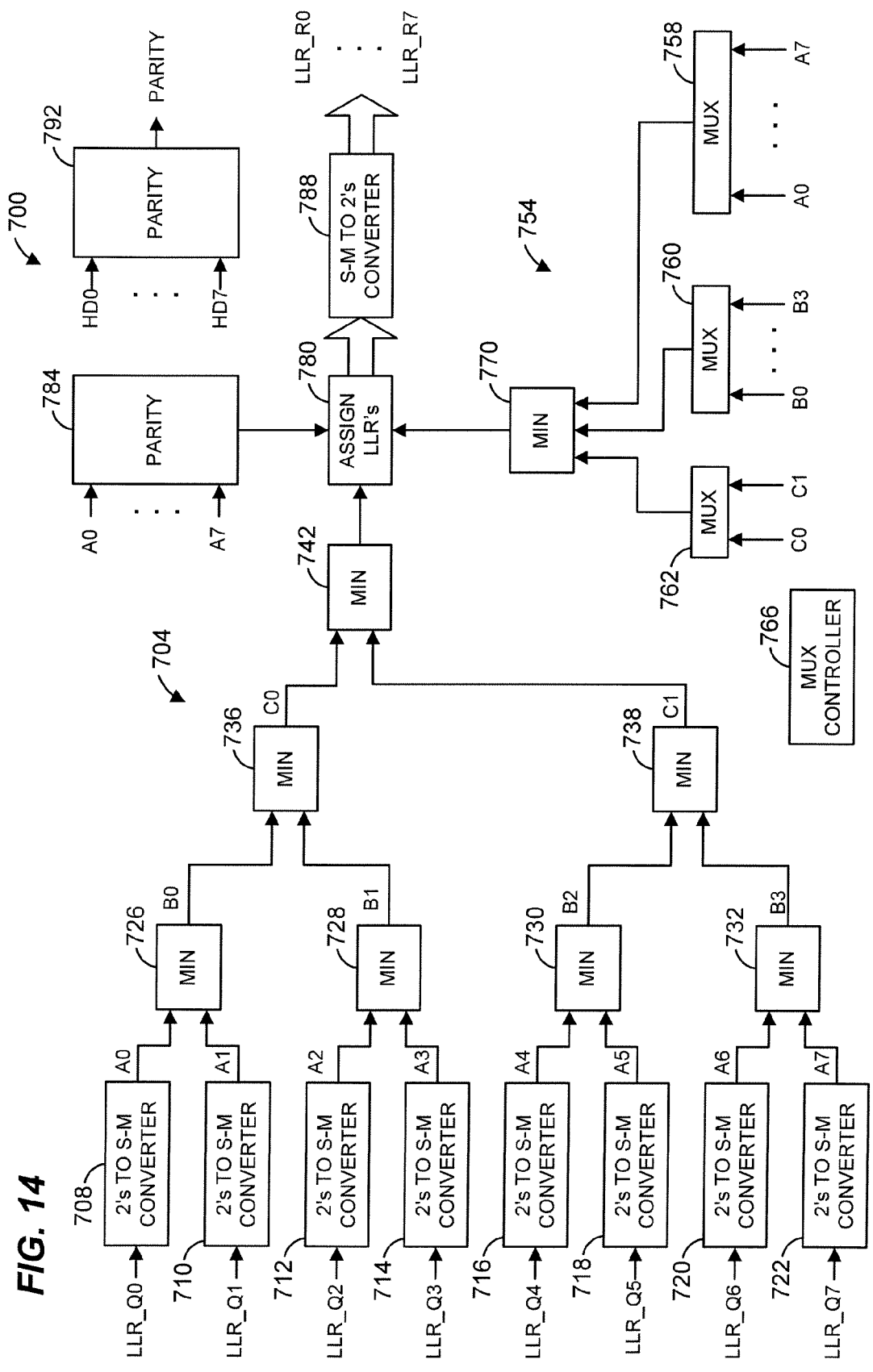
FIG. 14 is a block diagram of an example weight-eight check node processing element that may be utilized in the LDPC decoder processor of FIG. 7.

An example check node processing element corresponding to a weight eight check node will now be described. FIG. 14 is a block diagram of an example weight-eight check node processing element 700. Referring to FIG. 7, one or more of the check node processing elements 332 may include the weight-eight check node processing element 700, and FIG. 14 will be described with reference to FIG. 7 for ease of explanation. Of course, none of the check node processing elements 332 need include the weight-eight bit node processing element 700. Similarly, the weight-eight check node processing element 700 may be utilized in LDPC decoder processors other than the LDPC decoder processor 320 of FIG. 7.

The weight-eight check node processing element 700 receives values LLR_Q0, LLR_Q1, . . . , LLR_Q7, and generates values LLR_R0, LLR_R1, . . . , LLR_R7. The LLR_Q0, LLR_Q1, . . . , LLR_Q7 values may be received from one of the memory blocks 336. The LLR_R0, LLR_R1, . . . , LLR_R7 values may be written to the same memory block 336 from which the LLR_Q0, LLR_Q1, . . . , LLR_Q7 values were received.

The weight-eight check node processing element 700 receives hard decision bits HD0, HD1, . . . , HD7, and generates a parity check bit based on the decision bits HD0, HD1, . . . , HD7. The decision bits HD0, HD1, . . . , HD7 may be received from the same memory block 336 from which the LLR_Q0, LLR_Q1, . . . , LLR_Q7 values were received. Alternatively, the decision bits HD0, HD1, . . . , HD7 may be received from the memory blocks 348. The generated parity bit may be provided to the syndrome check block 352.

The check node processing element 700 includes a first minimum selection system 704 determines the minimum of the values LLR_Q0, LLR_Q1, . . . , LLR_Q7. The first minimum selection system 704 includes converters 708, 710, 712, 714, 716, 718, 720 and 722 that convert the LLR_Q values from twos-complement format to sign-magnitude format. The sign-magnitude values corresponding to the values LLR_Q0, LLR_Q1, . . . , LLR_Q7 are denoted in FIG. 14 as A0, A1, . . . , A7, respectively.

A minimum selection block 726 is coupled to an output of the converter 708 and an output of the converter 710. The minimum selection block 726 determines which of A0 and A1 has a smaller magnitude and provides that value at its output (B0). A minimum selection block 728 is coupled to an output of the converter 712 and an output of the converter 714. The minimum selection block 728 determines which of A2 and A3 has a smaller magnitude and provides that value at its output (B1). A minimum selection block 730 is coupled to an output of the converter 716 and an output of the converter 718. The minimum selection block 730 determines which of A4 and A5 has a smaller magnitude and provides that value at its output (B2). A minimum selection block 732 is coupled to an output of the converter 720 and an output of the converter 722. The minimum selection block 732 determines which of A6 and A7 has a smaller magnitude and provides that value at its output (B3).

A minimum selection block 736 is coupled to the output of the minimum selection block 726 and the output of the minimum selection block 728. The minimum selection block 736 determines which of B0 and B1 has a smaller magnitude and provides that value at its output (C0). A minimum selection block 738 is coupled to the output of the minimum selection block 730 and the output of the minimum selection block 732. The minimum selection block 738 determines which of B2 and B3 has a smaller magnitude and provides that value at its output (C1).

A final minimum selection block 742 is coupled to the output of the minimum selection block 736 and the output of the minimum selection block 738. The final minimum selection block determines which of C0 and C1 has a smaller magnitude and provides that value at its output. The output of the final minimum selection block 742 corresponds to the minimum of the values LLR_Q0, LLR_Q1, ..., LLR_Q7, but in a sign-magnitude format.

The check node processing element 700 also includes a second minimum selection system 754 that determines the second minimum of the values LLR_Q0, LLR_Q1, ..., LLR_Q7. The second minimum selection system 754 includes a multiplexer 758 having inputs coupled to the values A0, A1, ..., A7. A multiplexer 760 has inputs coupled to the values B0, B1, B2 and B3. A multiplexer 762 has inputs coupled to the values C0 and C1. The second minimum selection system 754 also includes a mux controller 766 coupled to the multiplexer 758, the multiplexer 760 and the multiplexer 762. The mux controller 766 also is coupled to the minimum selection block 726, the minimum selection block 728, the minimum selection block 730, the minimum selection block 732, the minimum selection block 736, the minimum selection block 738 and the final minimum selection block 742.

The mux controller 766 generates control signals for controlling the multiplexer 758, the multiplexer 760 and the multiplexer 762. In particular, the mux controller 766 causes the multiplexers 758, 760 and 762 to select three possible candidates for the second minimum value based on operation of the minimum selection block 726, the minimum selection block 728, the minimum selection block 730, the minimum selection block 732, the minimum selection block 736, the minimum selection block 738 and the final minimum selection block 742.

For example, the mux controller 766 causes the multiplexer 762 to select the C0 or C1 value that was not determined to be the minimum by the final minimum selection block 742. Also, if the final minimum selection block 742 determined that the C0 value was the minimum, the mux controller 766 causes the multiplexer 760 to select the B0 or B1 value that was not determined to be the minimum by the minimum selection block 736. If the final minimum selection block 742 determined that the C1 value was the minimum, the mux controller 766 causes the multiplexer 760 to select the B2 or B3 value that was not determined to be the minimum by the minimum selection block 738. If the final minimum selection block 742 determines that the C0 value was the minimum and the minimum selection block 736 determined that the B0 value was the minimum, the mux controller 766 causes the multiplexer 758 to select the A0 or A1 value that was not determined to be the minimum by the minimum selection block 726. If the final minimum selection block 742 determined that the C0 value was the minimum and the minimum selection block 736 determined that the B1 value was the minimum, the mux controller 766 causes the multiplexer 758 to select the A2 or A3 value that was not determined to be the minimum by the minimum selection block 728. If the final minimum selection block 742 determined that the C1 value was the minimum and the minimum selection block 738 determined that the B2 value was the minimum, the mux controller 766 causes the multiplexer 758 to select the A4 or A5 value that was not determined to be the minimum by the minimum selection block 730. If the final minimum selection block 742 determined that the C1 value was the minimum and the minimum selection block 738 determined that the B3 value was the minimum, the mux controller 766 causes the multiplexer 758 to select the A6 or A7 value that was not determined to be the minimum by the minimum selection block 730.

Outputs of the multiplexers 758, 760 and 762 are coupled to a minimum selection block 770. The minimum selection block 770 determines which of the outputs of the multiplexers 758, 760 and 762 has the smallest magnitude and provides that value at its output. The output of the minimum selection block 770 corresponds to the second minimum of the values LLR_Q0, LLR_Q1, ..., LLR_Q7, but in a sign-magnitude format.

The check node processing element 700 also includes an assign LLR_R values block 780 coupled to the output of the final minimum selection block 742 and the output of the minimum selection block 770. The assign LLR_R values block 780 is also coupled to the minimum selection blocks 726, 728, 730, 732, 736 and 738. The assign LLR_R values block 780 sets the magnitude of every one of the LLR_R values to the magnitude of the output of the final minimum selection block 742, except for the LLR_R value that corresponds to the minimum LLR_Q value. The assign LLR_R values block 780 sets the magnitude of the LLR_R value that corresponds to the minimum LLR_Q value to the magnitude of the output of the minimum selection block 770.

The assign LLR_R values block 780 is further coupled to an output of a parity calculator 784. The parity calculator 784 receives the sign portions of the values A0, ..., A7 and determines whether their parity is even or odd. The parity calculator 784 generates an output indicative of the parity of the values A0, ..., A7.

The assign LLR_R values block 780 sets the sign of each LLR_R value to the sign of the corresponding LLR_Q value if the output of the parity calculator 784 indicates that parity is even. The assign LLR_R values block 780 sets the sign of each LLR_R value to the opposite of the sign of the corresponding LLR_Q value if the output of the parity calculator 784 indicates that parity is odd.

A converter 788 is coupled to the output of the assign LLR_R values block 780. The converter 788 converts the LLR_R values generated by the assign LLR_R values block 780 from sign-magnitude format to twos-complement format.

The check node processing element 700 further includes a parity check block 792 that receives hard decision bits (HD0, HD1, ..., HD7) corresponding to the received LLR_Q values. In other words, parity check block 792 receives a hard decision bit HD0 from the bit check node that generated the LLR_Q0 value, a hard decision bit HD1 from the bit check node that generated the LLR_Q1 value, etc. The parity check block 792 generates a parity check bit based on the received hard decision bits.

One of ordinary skill in the art will recognize many alternatives and/or modifications to the weight-eight check node processing element 700. As just one example, conversion to and from twos-complement format may be omitted. As another example, the blocks 780 and 784 could be reversed in order. For example, the converter 788 could be coupled to the outputs of the final minimum selection block 742 and the minimum selection block 770. The assign LLR_R values block 780 could be coupled to the output of the converter 788. In this alternative, the converter 788 may convert the magnitudes of the outputs of the final minimum selection block 742 and the minimum selection block 770 to twos-complement format, and the assign LLR_R values block 780 could set the LLR_R values using the outputs of the converter 788.

Although examples in the context of a holographic storage system were discussed above, LDPC decoding techniques may be utilized in other contexts as well such as magnetic media storage devices (e.g., hard disk drives), optical storage devices such as digital versatile disks (DVDs) and compact disks (CDs), communication systems (e.g., digital audio broadcast (DAB) systems, digital video broadcast (DVB)

systems, wired and wireless local area network (LAN) systems, cellular systems, satellite communication systems, etc. Referring now to FIGS. 15A-15H, various example devices that may utilize LDPC decoding techniques such as described above will be described.

Figure 15A:
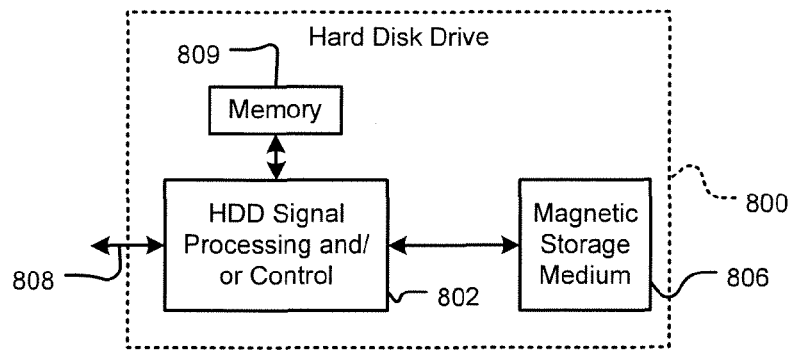
FIG. 15A is a block diagram of a hard disk drive that may utilize LDPC decoding techniques such as described herein.
Figure 15B:
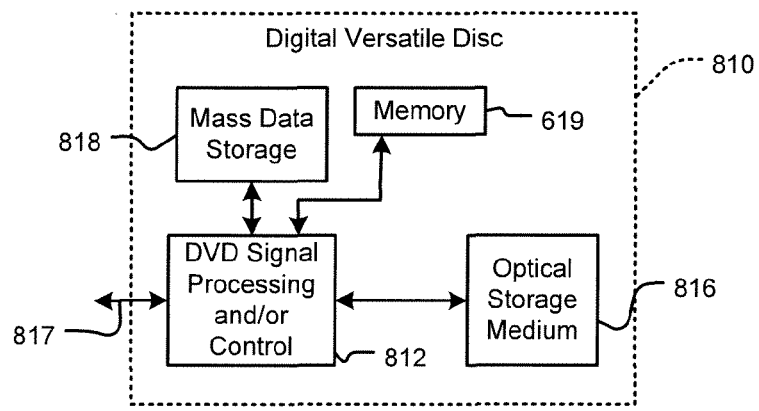
FIG. 15B is a block diagram of a digital versatile disk that may utilize LDPC decoding techniques such as described herein.

For example, referring to FIG. 15A, a hard disk drive 800 may include an LDPC decoder having components such as described above. For example, signal processing and/or control circuits, which are generally identified in FIG. 15A at 802, may include an LDPC decoder. In some implementations, signal processing and/or control circuit 802 and/or other circuits (not shown) in HDD 800 may process data, perform coding and/or encryption, perform calculations, and/or format data that is output to and/or received from a magnetic storage medium 806.

HDD 800 may communicate with a host device (not shown) such as a computer, mobile computing devices such as personal digital assistants, cellular phones, media or MP3 players and the like, and/or other devices via one or more wired or wireless communication links 808. HDD 800 may be connected to memory 809, such as random access memory (RAM), a low latency nonvolatile memory such as flash memory, read only memory (ROM) and/or other suitable electronic data storage.

Referring now to FIG. 5B, a digital versatile disc (DVD) drive 810 may utilize an LDPC decoder having components such as described above. For instance, signal processing and/or control circuits 812 may include an LDPC decoder. Signal processing and/or control circuit 812 and/or other circuits (not shown) in DVD 810 may process data, perform coding and/or encryption, perform calculations, and/or format data that is read from and/or data written to an optical storage medium 816. In some implementations, signal processing and/or control circuit 812 and/or other circuits (not shown) in DVD 810 can also perform other functions such as encoding and/or decoding and/or any other signal processing functions associated with a DVD drive.

DVD drive 810 may communicate with an output device (not shown) such as a computer, television or other device via one or more wired or wireless communication links 817. DVD 810 may communicate with mass data storage 818 that stores data in a nonvolatile manner. Mass data storage 818 may include a hard disk drive (HDD) such as that shown in FIG. 15A. The HDD may be a mini HDD that includes one or more platters having a diameter that is smaller than approximately 1.8". DVD 810 may be connected to memory 819, such as RAM, ROM, low latency nonvolatile memory such as flash memory, and/or other suitable electronic data storage.

Figure 15C:
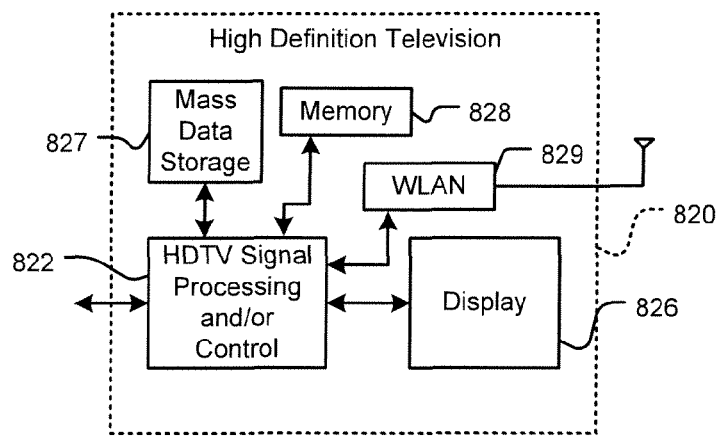
FIG. 15C is a block diagram of a high definition television that may utilize LDPC decoding techniques such as described herein.

Referring to FIG. 15C, a high definition television (HDTV) 820 may utilize an LDPC decoder having components such as described above. The HDTV 820 includes signal processing and/or control circuits, which are generally identified in FIG. 15C at 822, a WLAN interface 829, and a mass data storage 827. An LDPC decoder may be utilized in the WLAN interface 829 or the signal processing circuit and/or control circuit 822, for example. HDTV 820 receives HDTV input signals in either a wired or wireless format and generates HDTV output signals for a display 826. In some implementations, signal processing circuit and/or control circuit 822 and/or other circuits (not shown) of HDTV 820 may process data, perform coding and/or encryption, perform calculations, format data and/or perform any other type of HDTV processing that may be required.

HDTV 820 may communicate with mass data storage 827 that stores data in a nonvolatile manner such as optical and/or magnetic storage devices. The mass data storage 827 may include one or more holographic storage devices, one or more hard disk drives (HDDs) and/or one or more digital versatile disks (DVDs). At least one HDD may have the configuration shown in FIG. 15A and/or at least one DVD may have the configuration shown in FIG. 15B. One or more of the HDDs may be a mini HDD that includes one or more platters having a diameter that is smaller than approximately 1.8". HDTV 820 may be connected to memory 828 such as RAM, ROM, low latency nonvolatile memory such as flash memory and/or other suitable electronic data storage. HDTV 820 also may support connections with a WLAN via a WLAN network interface 829.

Figure 15D:
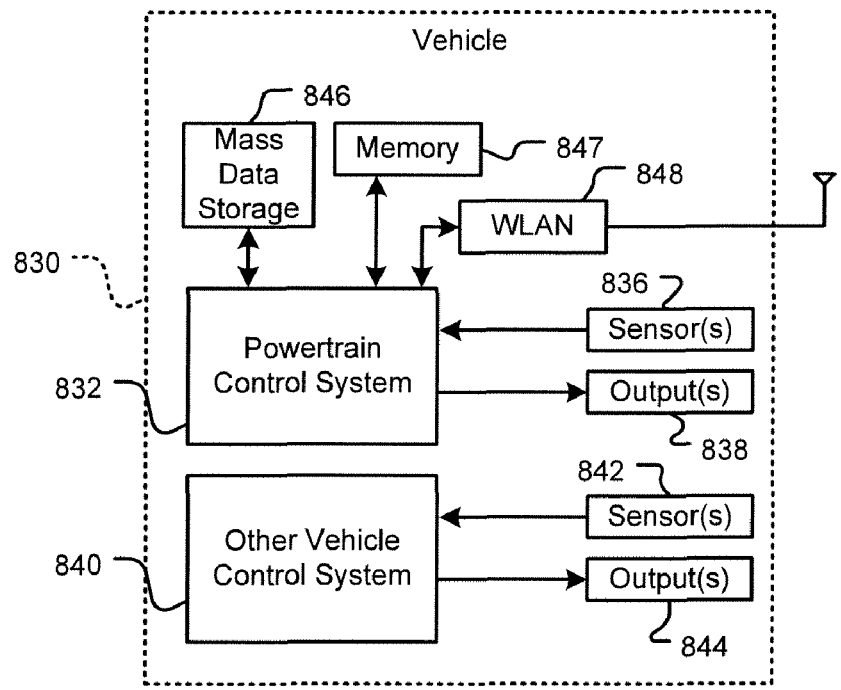
FIG. 15D is a block diagram of a vehicle that may utilize LDPC decoding techniques such as described herein.

Referring now to FIG. 15D, a control system of a vehicle 830 may utilize an LDPC decoder having components such as described above. In some implementations, a powertrain control system 832 receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals. The powertrain control system 832 may include an LDPC decoder.

A control system 840 may receive signals from input sensors 842 and/or output control signals to one or more output devices 844. In some implementations, control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Control systems 840 also may include an LDPC decoder. Still other implementations are contemplated.

Powertrain control system 832 may communicate with mass data storage 846 that stores data in a nonvolatile manner. Mass data storage 846 may include optical and/or magnetic storage devices, for example holographic storage device, HDDs and/or DVDs. At least one HDD may have the configuration shown in FIG. 15A and/or at least one DVD may have the configuration shown in FIG. 15B. One or more of the HDDs may be a mini HDD that includes one or more platters having a diameter that is smaller than approximately 1.8". Powertrain control system 832 may be connected to memory 847 such as RAM, ROM, low latency nonvolatile memory such as flash memory and/or other suitable electronic data storage. Powertrain control system 832 also may support connections with a WLAN via a WLAN network interface 848. The WLAN interface 848 may include an LDPC decoder. The control system 840 may also include mass data storage, memory and/or a WLAN interface (all not shown).

Figure 15E:
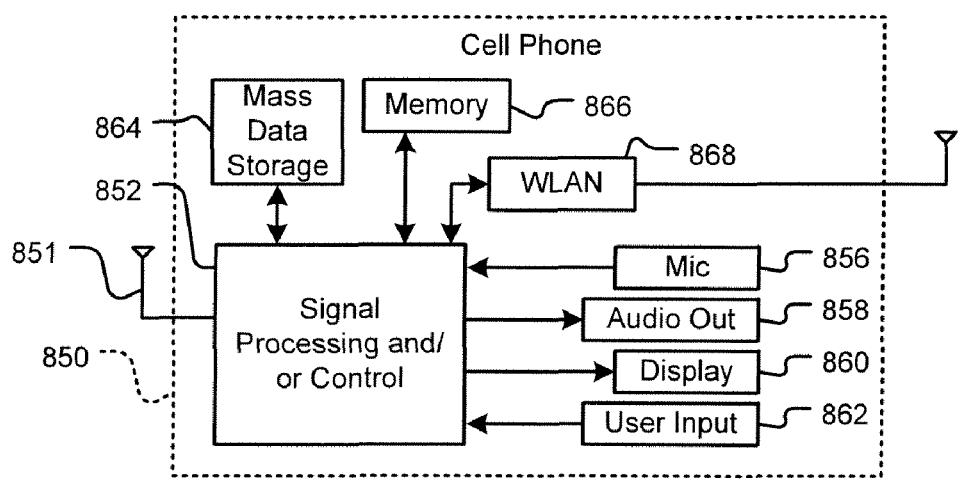
FIG. 15E is a block diagram of a cellular phone that may utilize LDPC decoding techniques such as described herein.

Referring now to FIG. 15E, a cellular phone 850 may utilize an LDPC decoder having components such as described above. The cellular phone 850 may include a cellular antenna 851, signal processing and/or control circuits, which are generally identified in FIG. 15E at 852, a WLAN interface 868, and a mass data storage 864. The signal processing and/or control circuits 552 and/or the WLAN interface 568, for example may include an LDPC decoder. In some implementations, cellular phone 850 includes a microphone 856, an audio output 858 such as a speaker and/or audio output jack, a display 860 and/or an input device 862 such as a keypad, pointing device, voice actuation and/or other input device. Signal processing and/or control circuits 852 and/or other circuits (not shown) in cellular phone 850 may process data, perform coding and/or encryption, perform calculations, format data and/or perform other cellular phone functions.

Cellular phone 850 may communicate with mass data storage 864 that stores data in a nonvolatile manner such as optical and/or magnetic storage devices, for example holographic storage devices, HDDs and/or DVDs. At least one HDD may have the configuration shown in FIG. 15A and/or at least one DVD may have the configuration shown in FIG. 15B. At least one HDD may be a mini HDD that includes one or more platters having a diameter that is smaller than approximately 1.8". Cellular phone 850 may be connected to memory 866 such as RAM, ROM, low latency nonvolatile memory such as flash memory and/or other suitable electronic data storage. Cellular phone 850 also may support connections with a WLAN via a WLAN network interface 868.

Figure 15F:
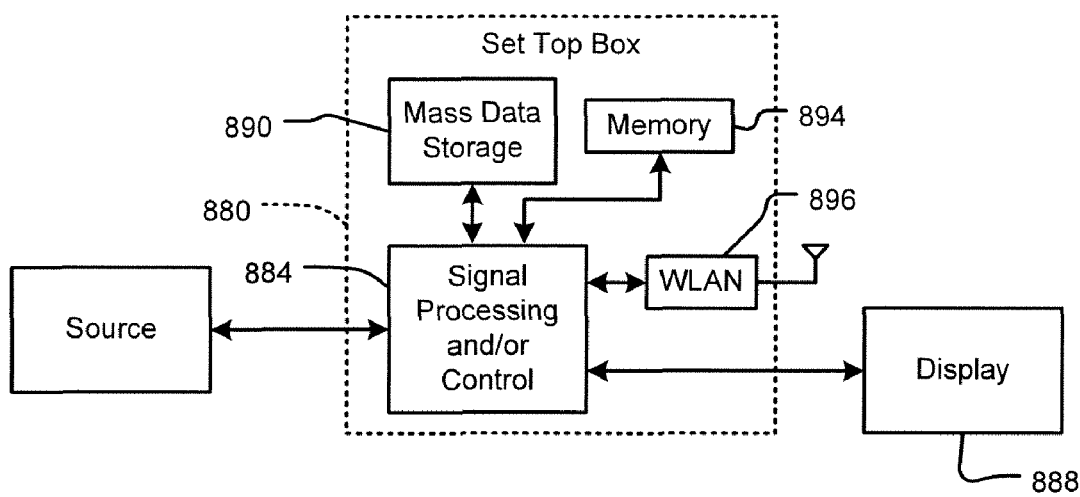
FIG. 15F is a block diagram of a set top box that may utilize LDPC decoding techniques such as described herein.

Referring now to FIG. 15F, a set top box 880 may utilize an LDPC decoder having components such as described above. The set top box 880 includes signal processing and/or control circuits, which are generally identified in FIG. 15F at 884, a WLAN interface 896, and a mass data storage device 890. An LDPC decoder may be utilized in the signal processing and/or control circuits 884 and/or the WLAN interface 896, for example. Set top box 880 receives signals from a source such as a broadband source and outputs standard and/or high definition audio/video signals suitable for a display 888 such as a television and/or monitor and/or other video and/or audio output devices. Signal processing and/or control circuits 884 and/or other circuits (not shown) of the set top box 880 may process data, perform coding and/or encryption, perform calculations, format data and/or perform any other set top box function.

Set top box 880 may communicate with mass data storage 890 that stores data in a nonvolatile manner. Mass data storage 890 may include optical and/or magnetic storage devices, for example holographic storage devices, HDDs and/or DVDs. At least one HDD may have the configuration shown in FIG. 15A and/or at least one DVD may have the configuration shown in FIG. 15B. At least one HDD may be a mini HDD that includes one or more platters having a diameter that is smaller than approximately 1.8". Set top box 880 may be connected to memory 894 such as RAM, ROM, low latency nonvolatile memory such as flash memory and/or other suitable electronic data storage. Set top box 880 also may support connections with a WLAN via a WLAN network interface 8896.

Figure 15G:
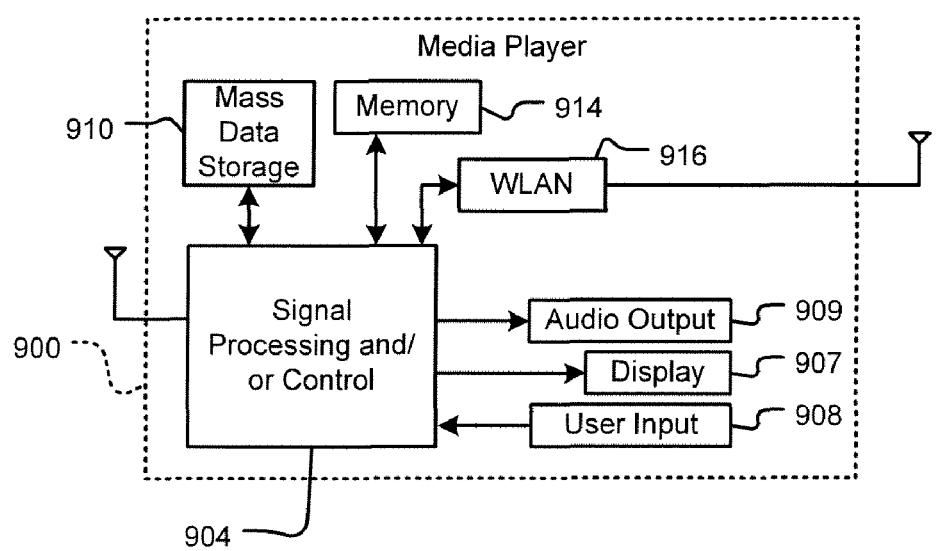
FIG. 15G is a block diagram of a media player that may utilize LDPC decoding techniques such as described herein.

Referring now to FIG. 15G, a media player 900 may utilize an LDPC decoder having components such as described above. The media player 900 may include signal processing and/or control circuits, which are generally identified in FIG. 15G at 904, a WLAN interface 916, and a mass data storage device 910. An LDPC decoder may be utilized in the signal processing and/or control circuits 904 and/or the WLAN interface 916, for example. In some implementations, media player 900 includes a display 907 and/or a user input 908 such as a keypad, touchpad and the like. In some implementations, media player 900 may employ a graphical user interface (GUI) that typically employs menus, drop down menus, icons and/or a point-and-click interface via display 907 and/or user input 908. Media player 900 further includes an audio output 909 such as a speaker and/or audio output jack. Signal processing and/or control circuits 904 and/or other circuits (not shown) of media player 900 may process data, perform coding and/or encryption, perform calculations, format data and/or perform any other media player function.

Media player 900 may communicate with mass data storage 910 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example holographic storage devices, HDDs and/or DVDs. At least one HDD may have the configuration shown in FIG. 15A and/or at least one DVD may have the configuration shown in FIG. 15B. At least one HDD may be a mini HDD that includes one or more platters having a diameter that is smaller than approximately 1.8". Media player 900 may be connected to memory 914 such as RAM, ROM, low latency nonvolatile memory such as flash memory and/or other suitable electronic data storage. Media player 900 also may support connections with a WLAN via a WLAN network interface 916. Still other implementations in addition to those described above are contemplated.

Figure 15H:
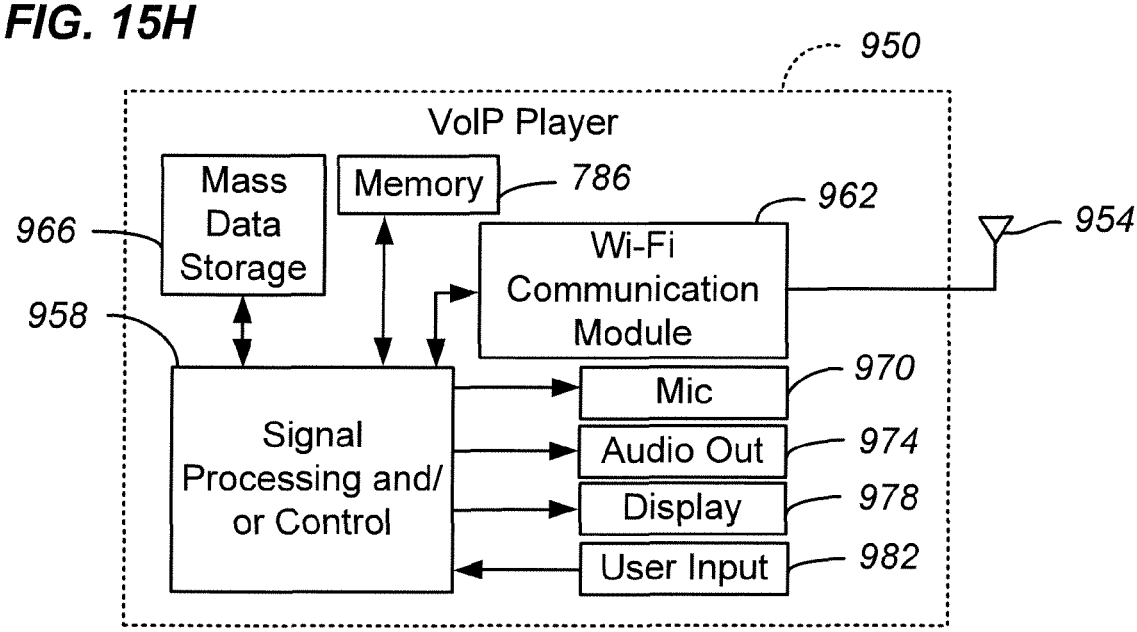
FIG. 15H is a block diagram of a voice over IP device that may utilize LDPC decoding techniques such as described herein.

Referring to FIG. 15H, a Voice over Internet Protocol (VoIP) phone 950 may utilize an LDPC decoder having components such as described above. The VoIP phone may include an antenna 954, signal processing and/or control circuits 958, a wireless interface 962, and a mass data storage 966. An LDPC decoder may be utilized in the signal processing and/or control circuits 958 and/or the wireless interface 962, for example. In some implementations, VoIP phone 950 includes, in part, a microphone 970, an audio output 974 such as a speaker and/or audio output jack, a display monitor 978, an input device 982 such as a keypad, pointing device, voice actuation and/or other input devices, and a Wireless Fidelity (Wi-Fi) communication module 962. Signal processing and/or control circuits 958 and/or other circuits (not shown) in VoIP phone 950 may process data, perform coding and/or encryption, perform calculations, format data and/or perform other VoIP phone functions.

VoIP phone 950 may communicate with mass data storage 966 that stores data in a nonvolatile manner such as optical and/or magnetic storage devices, for example holographic storage devices, HDDs and/or DVDs. At least one HDD may have the configuration shown in FIG. 15A and/or at least one DVD may have the configuration shown in FIG. 15B. The HDD may be a mini HDD that includes one or more platters having a diameter that is smaller than approximately 1.8". VoIP phone 950 may be connected to memory 986, which may be a RAM, ROM, low latency nonvolatile memory such as flash memory and/or other suitable electronic data storage. VoIP phone 950 is configured to establish communications link with a VoIP network (not shown) via Wi-Fi communication module 962.

The various blocks, operations, and techniques described above may be implemented in hardware, firmware, software, or any combination of hardware, firmware, and/or software. When implemented in hardware, some or all of the blocks, operations, techniques, etc. may be implemented in, for example, a custom integrated circuit (IC), an application specific integrated circuit (ASIC), a field programmable logic array (FPGA), a programmable logic array (PLA), etc.

When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A low-density parity-check (LDPC) decoder apparatus, comprising:
    a plurality of bit node processing elements;
    a plurality of check node processing elements;
    a plurality of message passing memory blocks;
    a first routing matrix to couple the plurality of bit node processing elements to the plurality of message passing memory blocks; and
    a second routing matrix to couple the plurality of check node processing elements to the plurality of message passing memory blocks;
    wherein the first routing matrix and the second routing matrix are configured to couple each of a plurality of bit node processing element and check node processing element pairs to a corresponding one of the message passing memory blocks, so that, for each pair,
        a bit-node-to-check-node LDPC decoding message from the bit node processing element of the pair is routed to the check node processing element of the pair via the first routing matrix, the second routing matrix, and the corresponding one of the message passing memory blocks, and
        a check-node-to-bit-node LDPC decoding message from the check node processing element of the pair is routed to the bit node processing element of the pair via the first routing matrix, the second routing matrix, and the corresponding one of the message passing memory blocks.

2. An apparatus according to claim 1, wherein a mother matrix corresponding to an LDPC code to be decoded by the LDPC decoder apparatus is a sparse matrix including Z circulant sub-matrices, wherein Z is a positive integer; and
    wherein each of the plurality of message passing memory blocks corresponds to a different one of the Z circulant sub-matrices.

3. An apparatus according to claim 2, wherein the mother matrix includes Y block columns, wherein Y is a positive integer; and
    wherein each of the plurality of bit node processing elements corresponds to a different one of the Y block columns.

4. An apparatus according to claim 3, wherein the mother matrix includes X block rows, wherein X is a positive integer; and
    wherein each of the plurality of check node processing elements corresponds to a different one of the X block rows.

5. An apparatus according to claim 4, wherein the first routing matrix couples each message passing memory block to one of the bit node processing elements.

6. An apparatus according to claim 4, wherein the second routing matrix couples each message passing memory block to one of the check node processing elements.

7. An apparatus according to claim 1, further comprising a syndrome check block coupled to the plurality of check node processing elements.

* * * * *